(12) United States Patent
Varsha et al.

(10) Patent No.: US 10,222,402 B2
(45) Date of Patent: Mar. 5, 2019

(54) CURRENT SENSING IN A USB POWER CONTROL ANALOG SUBSYSTEM

(71) Applicant: Cypress Semiconductor Corporation, San Jose, CA (US)

(72) Inventors: Vaidyanathan Varsha, Milpitas, CA (US); Derwin W. Mattos, San Mateo, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/924,689

(22) Filed: Mar. 19, 2018

(65) Prior Publication Data
US 2018/0335454 A1     Nov. 22, 2018

Related U.S. Application Data

(63) Continuation-in-part of application No. 15/848,412, filed on Dec. 20, 2017.
(Continued)

(51) Int. Cl.
    *G06F 1/26*         (2006.01)
    *H02H 1/00*       (2006.01)
(Continued)

(52) U.S. Cl.
CPC ....... *G01R 19/16538* (2013.01); *G01R 19/10* (2013.01); *G01R 19/16504* (2013.01); *G06F 1/266* (2013.01); *H02H 1/0007* (2013.01); *H02H 3/08* (2013.01); *H03F 3/45071* (2013.01); *H03F 3/68* (2013.01); *H03G 3/30* (2013.01); *H02M 3/33592* (2013.01); *H03F 2200/171* (2013.01); *H03F 2200/375* (2013.01);
(Continued)

(58) Field of Classification Search
CPC ........ G01R 19/16538; G01R 19/16504; G01R 19/10; G06F 1/266; H02J 7/045; H02J 7/04; H02H 3/08; H02H 1/0007; H03G 3/30; H03F 3/45071
See application file for complete search history.

(56) References Cited

U.S. PATENT DOCUMENTS 7,528,574 B1 * 5/2009 Adkins ................ H01M 10/44
                                                                320/128
8,058,910 B1    11/2011 Wright
(Continued)

OTHER PUBLICATIONS

"USB Power Delivery 4-Switch Buck Boost Controller," On Semiconductor [online], Semiconductor Components Industries LLC, published on Jan. 2017 [retrieved on Oct. 9, 2017] retrieved from internet; 18 pages.
(Continued)

*Primary Examiner* — Tim T Vo
*Assistant Examiner* — Phong H Dang

(57) ABSTRACT

A device includes a power control analog subsystem of a universal serial bus-power delivery (USB-PD) compatible power supply device. The power control analog subsystem includes a programmable current sensing circuit and a current sense resistor coupled to the power control analog subsystem. The power control analog subsystem is configured to concurrently compare a current flow through the current sense resistor with at least three different reference values, e.g., compare a sensed voltage with at least three different reference voltages.

17 Claims, 28 Drawing Sheets

Related U.S. Application Data

(60) Provisional application No. 62/508,001, filed on May 18, 2017, provisional application No. 62/508,141, filed on May 18, 2017.

(51) Int. Cl.

| | | |
|---|---|---|
| *H02H 3/08* | (2006.01) | |
| *H03F 3/45* | (2006.01) | |
| *H03F 3/68* | (2006.01) | |
| *H03G 3/30* | (2006.01) | |
| *G01R 19/10* | (2006.01) | |
| *G01R 19/165* | (2006.01) | |
| *H02M 3/335* | (2006.01) | |

(52) U.S. Cl.
CPC .. *H03F 2200/381* (2013.01); *H03F 2200/426* (2013.01); *H03F 2200/471* (2013.01); *H03F 2200/481* (2013.01); *H03F 2200/78* (2013.01)

(56) References Cited

U.S. PATENT DOCUMENTS

| | | | |
|---|---|---|---|
| 8,427,121 B2 | 4/2013 | Notman | |
| 8,892,914 B2 | 11/2014 | Huynh | |
| 9,343,982 B2 | 5/2016 | Yang | |
| 9,543,844 B2 | 1/2017 | Gong et al. | |
| 9,684,350 B2 | 6/2017 | Low | |
| 9,710,406 B2 | 7/2017 | Pethe et al. | |
| 9,748,788 B2 | 8/2017 | Sporck et al. | |
| 2001/0007134 A1* | 7/2001 | Odaohhara | G06F 1/263 |
| | | | 713/300 |
| 2003/0095368 A1 | 5/2003 | Daniels et al. | |
| 2004/0095114 A1 | 5/2004 | Kemahan | |
| 2006/0033474 A1* | 2/2006 | Shum | H02J 7/045 |
| | | | 320/128 |
| 2009/0167093 A1 | 7/2009 | Nguyen et al. | |
| 2009/0198841 A1* | 8/2009 | Yoshida | G06F 13/4295 |
| | | | 710/16 |
| 2009/0206794 A1 | 8/2009 | Ferguson | |
| 2009/0295339 A1 | 12/2009 | Wong | |
| 2009/0322302 A1* | 12/2009 | Fukushi | H02M 1/32 |
| | | | 323/284 |
| 2010/0073090 A1* | 3/2010 | Mattos | H03F 1/52 |
| | | | 330/254 |
| 2011/0016334 A1 | 1/2011 | Tom et al. | |
| 2012/0223682 A1* | 9/2012 | Hussain | H02J 7/0073 |
| | | | 320/164 |
| 2013/0043828 A1 | 2/2013 | Gurlahosur | |
| 2013/0088203 A1* | 4/2013 | Solie | H02J 7/022 |
| | | | 320/129 |
| 2013/0113415 A1 | 5/2013 | Chen et al. | |
| 2013/0286525 A1* | 10/2013 | Kanamori | H02H 9/004 |
| | | | 361/101 |
| 2014/0092505 A1* | 4/2014 | Norris | H02H 9/02 |
| | | | 361/56 |
| 2014/0184173 A1* | 7/2014 | Szepesi | H02J 7/0068 |
| | | | 320/164 |
| 2014/0195065 A1 | 7/2014 | Yang | |
| 2014/0282349 A1* | 9/2014 | Feng | G06F 17/5063 |
| | | | 716/136 |
| 2014/0313794 A1 | 10/2014 | Ono et al. | |
| 2015/0277461 A1 | 10/2015 | Anderson et al. | |
| 2015/0357849 A1* | 12/2015 | Wong | H02J 7/0052 |
| | | | 320/107 |
| 2016/0079155 A1 | 3/2016 | Kawase et al. | |
| 2016/0124478 A1 | 5/2016 | Beeston et al. | |
| 2016/0190794 A1 | 6/2016 | Forghani-zadeh et al. | |
| 2016/0342492 A1 | 11/2016 | Chen et al. | |
| 2016/0349814 A1 | 12/2016 | Carpenter, Jr. et al. | |
| 2016/0372936 A1 | 12/2016 | Agarwal et al. | |
| 2017/0192446 A1 | 7/2017 | Su et al. | |
| 2017/0331270 A1 | 11/2017 | Mattos et al. | |

OTHER PUBLICATIONS

International Search Report for International Application No. PCT/US18/19991 dated Mar. 23, 2018; 3 pages.
USPTO Non-Final Rejection for U.S. Appl. No. 15/848,412 dated Mar. 7, 2018; 22 pages.
Written Opinion of the International Searching Authority for International Application No. PCT/US18/19991 dated Mar. 23, 2018; 12 pages.
USPTO Applicant-Initiated Interview Summary for U.S. Appl. No. 15/848,412 dated May 3, 2018; 3 pages.
USPTO Advisory Action for U.S. Appl. No. 15/848,412 dated Oct. 5, 2018; 3 pages.
USPTO Applicant Initiated Interview Summary for U.S. Appl. No. 15/848,412 dated Sep. 27, 2018; 3 pages.
USPTO Final Rejection for U.S. Appl. No. 15/848,412 dated Aug. 27, 2018; 24 pages.
Chen et al. "A Dynamic Bootstrap Voltage Technique for a High-Efficiency Buck Converter in a Universal Serial Bus Power Delivery Device," IEEE Transactions on Power Electronics, vol. 31, No. 4, April 2016, 14 pages.
International Search Report for International Application No. PCT/US2018/030947 dated Jul. 23, 2018, 3 pages.
Written Opinion of the International Searching Authority for International Application No. PCT/US2018/030947 dated Jul. 23, 2018, 5 pages.
USPTO Notice of Allowance for U.S. Appl. No. 15/848,412 dated Nov. 29, 2018; 8 pages.

* cited by examiner

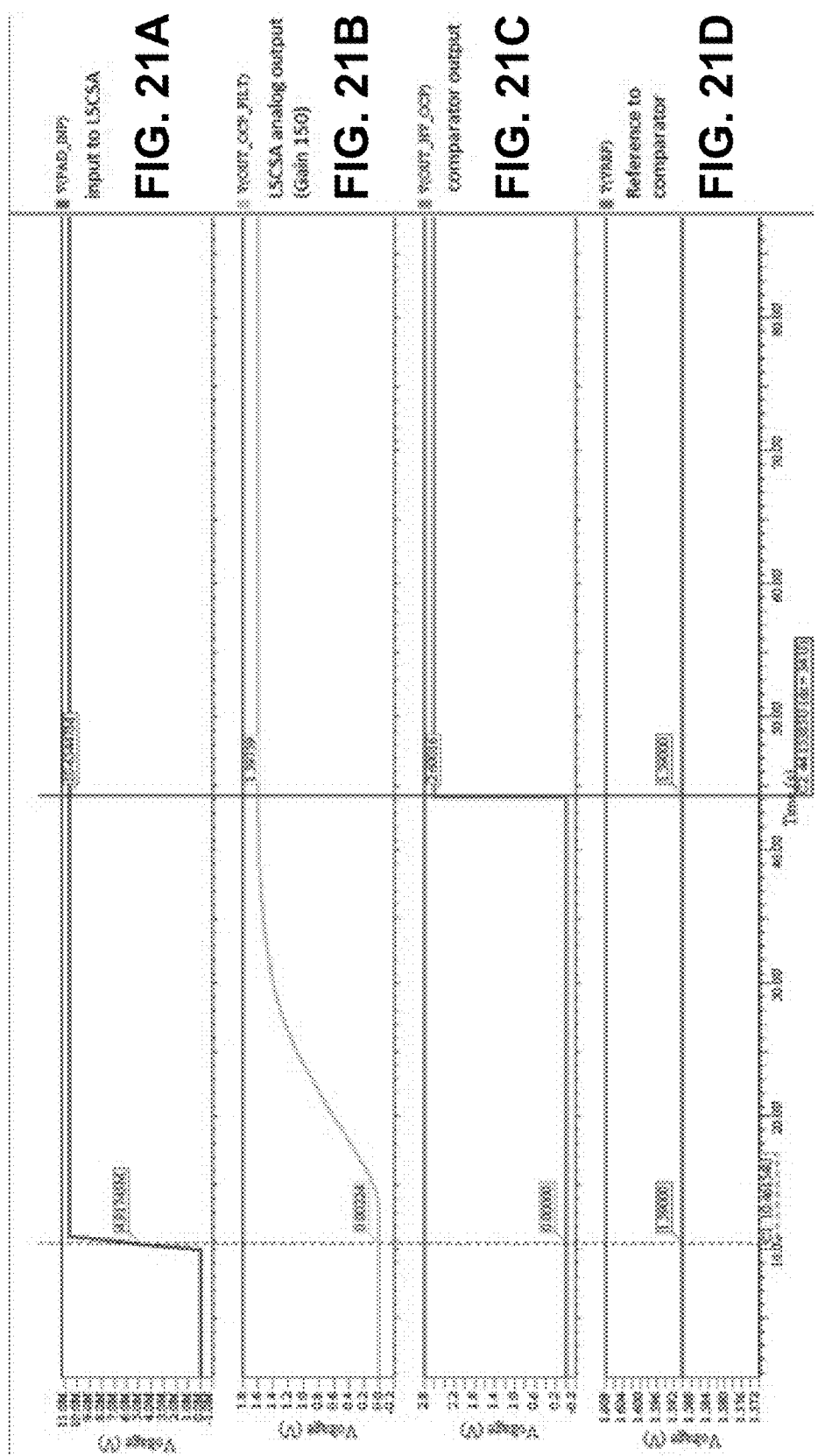

US 10,222,402 B2

CURRENT SENSING IN A USB POWER CONTROL ANALOG SUBSYSTEM

RELATED APPLICATIONS

This application claims the benefit and priority to U.S. Provisional Application No. 62/508,141, filed on May 18, 2017, and is a continuation-in-part of U.S. patent application Ser. No. 15/848,412, filed Dec. 20, 2017, which claims priority to U.S. Provisional Application No. 62/508,001, filed on May 18, 2017, the contents of each of which are hereby incorporated by this reference herein.

TECHNICAL FIELD

The disclosure relates to the field of electronic circuits, in particular to current sensing by a programmable current sensing circuit of a power control analog subsystem.

BACKGROUND

Electronic circuits may include individual electronic components, such as resistors, transistors, capacitors, inductors, and diodes, among others, connected by conductive wires or traces through which electric current can flow. Electronic circuits may be constructed using discrete components, or more commonly integrated in an integrated circuit where the components and interconnections are formed on a common substrate, such as silicon.

BRIEF DESCRIPTION OF THE DRAWINGS

The disclosure is illustrated by way of example, and not of limitation, in the figures of the accompanying drawings.

FIG. 21A is a graph illustrating a step input voltage into the disclosed current sense amplifier, according to one embodiment.

FIG. 21B is a graph illustrating an analog output voltage of the current sense amplifier in response to the set input voltage of FIG. 21A, according to one embodiment.

FIG. 21C is a graph illustrating an output of a comparator for over current protection in response to the analog output voltage of FIG. 21B, according to one embodiment.

FIG. 21D is a graph illustrating a reference voltage input into the comparator of FIG. 21C, according to one embodiment.

DETAILED DESCRIPTION

Figure 1:
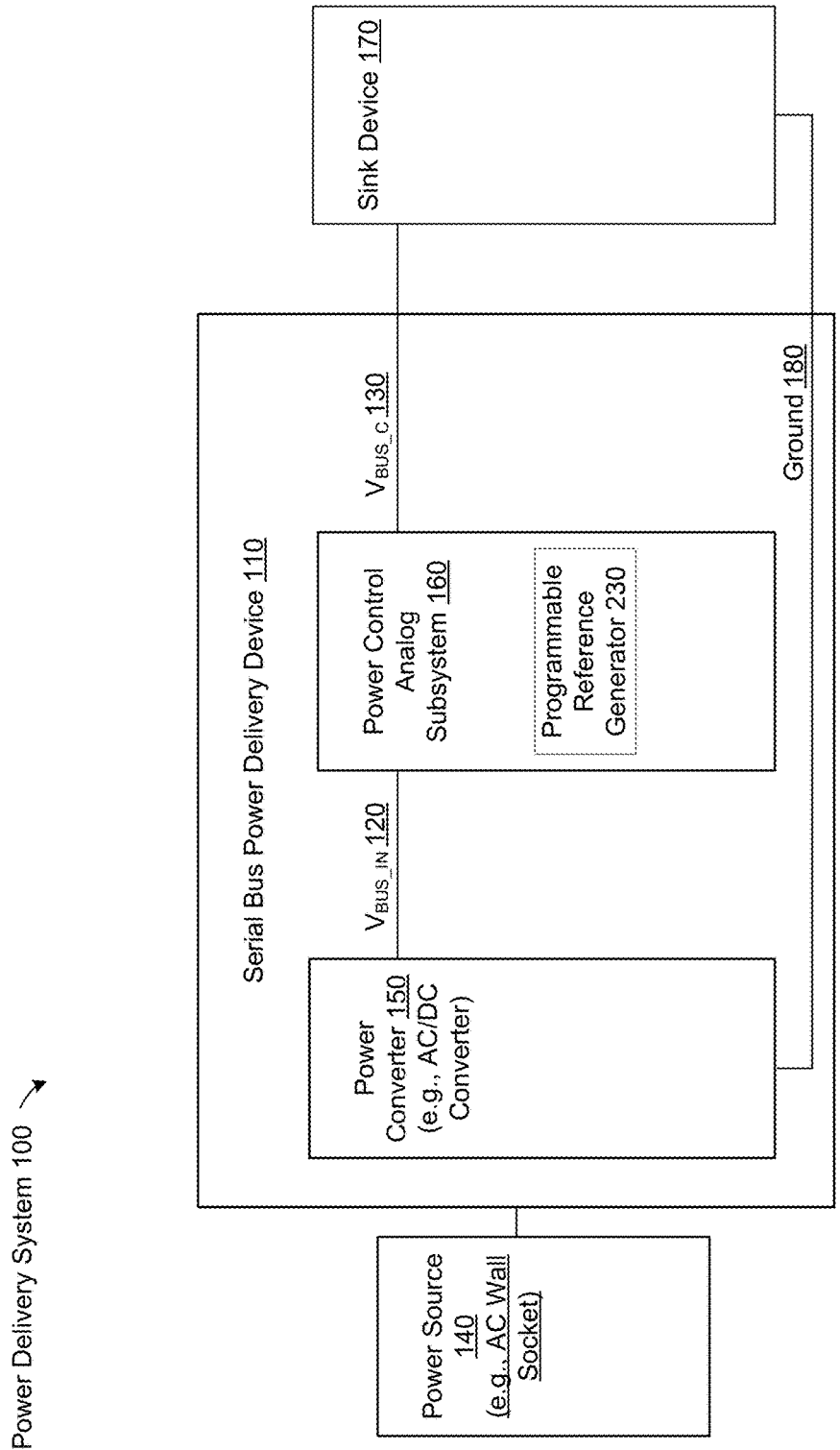
FIG. 1 is a block diagram of a power delivery system, according to some embodiments.

A programmable circuit may be an electronic circuit, such as an integrated circuit (IC) that has multiple components that are reconfigurable to perform various operations or functions. Unlike fixed function circuits, programmable circuits may be programmed (e.g., configured or reconfigured) during operation (e.g., field-programmable, dynamic) or prior to use to execute some functions and not execute other functions. In addition, a programmable circuit may be configured or reconfigured during operation based on the programming of the programmable circuit (e.g., run-time configurable). Programmable circuits may be reprogrammed multiple times to execute different operations and functions.

Application demand has increased the desire for programmable circuits with increased flexibility to support diverse applications. Rather than support some operations with off-chip components, designers are tasked with bringing functionality to programmable circuits to improve performance, cost, meet customer demands, and repurpose functional blocks to perform multiple functions. For example, programmable circuits may require multiple, adjustable sense and interrupt functions (e.g., over-voltage (OV), under-voltage (UV), over-current, and short-circuit detection). Various functions may be designed as stand-alone blocks. Each stand-alone block may require its own reference generator and programmable settings. For example, a programmable circuit may have two circuits that each has its own comparators and reference generators (e.g., current sense amplifier (CSA) and under-voltage over-voltage (UVOV) detection circuit). Traditionally, a reference generator does not provide reference signals for multiple, simultaneous functions (e.g., over current protection (OCP), short circuit protection (SCP), power factor correction (PFC), and synchronous rectification (SR)). Traditionally, components cannot be time-multiplexed in a programmable circuit (e.g., comparator for OV cannot be used for PFC). Using a programmable integrated circuit (IC) to implement various analog functions may not apply to some applications. For example, programmable integrated circuit may not apply to universal serial bus-power delivery (USB-PD) Type-C (USB Type-C™, USB-C™) applications.

The embodiments described herein may address the above-mentioned and other challenges by providing, a serial bus-compatible power supply device, such as a serial bus power delivery (SBPD) device with a power control analog subsystem having a programmable reference generator, multiplexers, and comparators that are used to provide multiple interrupt functions. The SBPD (also referred to as a "source device" herein) may be a USB compatible power supply device.

In some embodiments, a SBPD device may include a register set to store register values to program reference voltages. The SBPD device may also include a central processing unit (CPU), coupled to the register set, to store the register values in the register set. The CPU may include inputs to receive system interrupts from the SBPD based on the sensing and monitoring done by the SBPD device. The SBPD device may also include a power control analog system coupled to the CPU and the register set. The power control analog system may include a programmable reference generator to generate corresponding reference voltages in response to the corresponding register values. The power control analog system may include multiplexers, coupled to a first voltage and a second voltage, to output corresponding selected voltages. The power control analog system may include comparators, coupled to receive a corresponding reference voltage from the programmable reference generator and to receive a corresponding selected voltage from a corresponding multiplexer. Each comparator may output a corresponding system interrupt to the CPU based on a corresponding voltage condition. In other embodiments, the outputs of the comparators can be control signals to control other circuitry, such as a discharge circuit as described herein.

In related or separate embodiments, the power control analog subsystem includes a programmable current sensing circuit and a current sense resistor coupled to the power control analog subsystem. The power control analog subsystem may be configured to concurrently compare a current flow through the current sense resistor with at least three different reference values, e.g., compare a sensed voltage with at least three different reference voltages. The current sense resistor may be coupled between the power control analog subsystem and either a power supply voltage bus (VBUS) terminal or a ground terminal. The ground terminal may be coupled to a ground return path of the VBUS.

More specifically, in various embodiments, the programmable current sensing circuit may include a current sense amplifier coupled to the current sense resistor. The current sense amplifier may sense a voltage across the current sense resistor and amplify the voltage, using multiple gain options, to generate multiple analog output voltages (at least three in number). The current sensing circuit may further include multiple comparators (also at least there in number) coupled to the current sense amplifier to compare respective analog output voltages with a corresponding reference voltage selected from a least three different reference voltages. A first comparator of the multiple comparators may generate a digital signal that functions as a system interrupt in response to detection of a first analog output voltage of the multiple analog output voltages exceeding a corresponding first reference voltage of the multiple reference voltages. Each comparator may output a different warning or system interrupt depending on the application for which the input reference voltage is adapted to detect. For example, the comparators may respective trigger system interrupts indicative of conditions such as OCP, SCP, PFC, and SR.

FIG. 1 is a block diagram of a power delivery system 100 (also referred to as "system" herein). System 100 includes a serial bus-compatible power supply device 110. An example of a serial bus-compatible power supply device 110 may include a serial bus power delivery (SBPD) device 110 or a USB-compatible power supply device. It may be noted that serial bus power delivery device is referred to SBPD device, herein, for an example. In some embodiments, SBPD device 110 is USB-PD device that is compatible with the USB-PD standard or more generally with the USB standard. For example, SBPD device 110 may be used to provide an output voltage (e.g., Vbus_c 130, power supply voltage) based on an input voltage (e.g., Vbus_in 120, power supply voltage). The SBPD device 110 may be used to provide dynamic programmability of Vbus_c 130 in a range of voltages (e.g., 3 volts (V) to 22 V) within a defined tolerance (e.g., 5% tolerance) and in small increments (e.g., 20 millivolts (mV)). Dynamic programmability may refer to the ability to program different output voltages while a device is powered. In some embodiments, the current supplied by SBPD device 110 may also be configurable and programmable and support a range of supplied current, such as from 500 milliamperes (mA) to 5 amperes (A). It may be noted that voltage bus may refer to the physical connection (e.g., bus) on which Vbus_c 130 is conducted.

The SBPD device 110 may include a power converter 150 (e.g., an AC/DC converter) and a power control analog subsystem 160 (e.g., a USB-PD controller). The power control analog subsystem 160 may include a programmable reference generator 230. The programmable reference generator 230 may generate multiple reference voltages for different functions (e.g., OV, UV, OCP, SCP, PFC, SR, etc.). In embodiments, SBPD device 110 is connected to power source 140. In some embodiments, the power source 140 may be a wall socket power source that provides alternating current (AC) power. In other embodiments, power source 140 may be a different power source, such as a battery, and may provide direct current (DC) power to SBPD device 110. Power converter 150 may convert the power received from power source 140 (e.g., convert power received to Vbus_in 120). For example, power converter 150 may be an AC/DC converter and convert AC power from power source 140 to DC power. In some embodiments, power converter 150 is a flyback converter, such as an optocoupler-based flyback converter, that provides galvanic isolation between the input (e.g., primary side) and the output (e.g., secondary side).

In some embodiments, SBPD device 110 provides Vbus_c 130 to a sink device 170 (e.g., via communication channel (CC) specifying a particular output voltage, and possibly an output current). SBPD device 110 may also provide access to ground potential (e.g., ground 180) to the sink device 170. In some embodiments, the providing of the Vbus_c 130 is compatible with the USB-PD standard. Power control analog subsystem 160 may receive Vbus_in 120 from power converter 150. The power control analog subsystem 160 may output Vbus_in 130. In some embodiments, power control analog subsystem 160 is a USB Type-C™ controller compatible with the USB Type-C™ standard. As will be further described in the following figures, power control analog subsystem 160 may provide system interrupts responsive to the Vbus_in 120 and the Vbus_c 130.

In some embodiments, any of the components of SBPD device 110 may be part of an IC or alternatively any of the components of SBPD device 110 may be implemented in its own IC. For example, power converter 150 and power control analog subsystem 160 may each be discrete ICs with separate packaging and pin configurations.

In some embodiments, the SBPD device 110 may provide a complete USB Type-C™ and USB-Power Delivery port control solution for notebooks, dongles, monitors, docking stations, power adapters, vehicle chargers, power banks, mobile adaptors, and the like.

Figure 2:
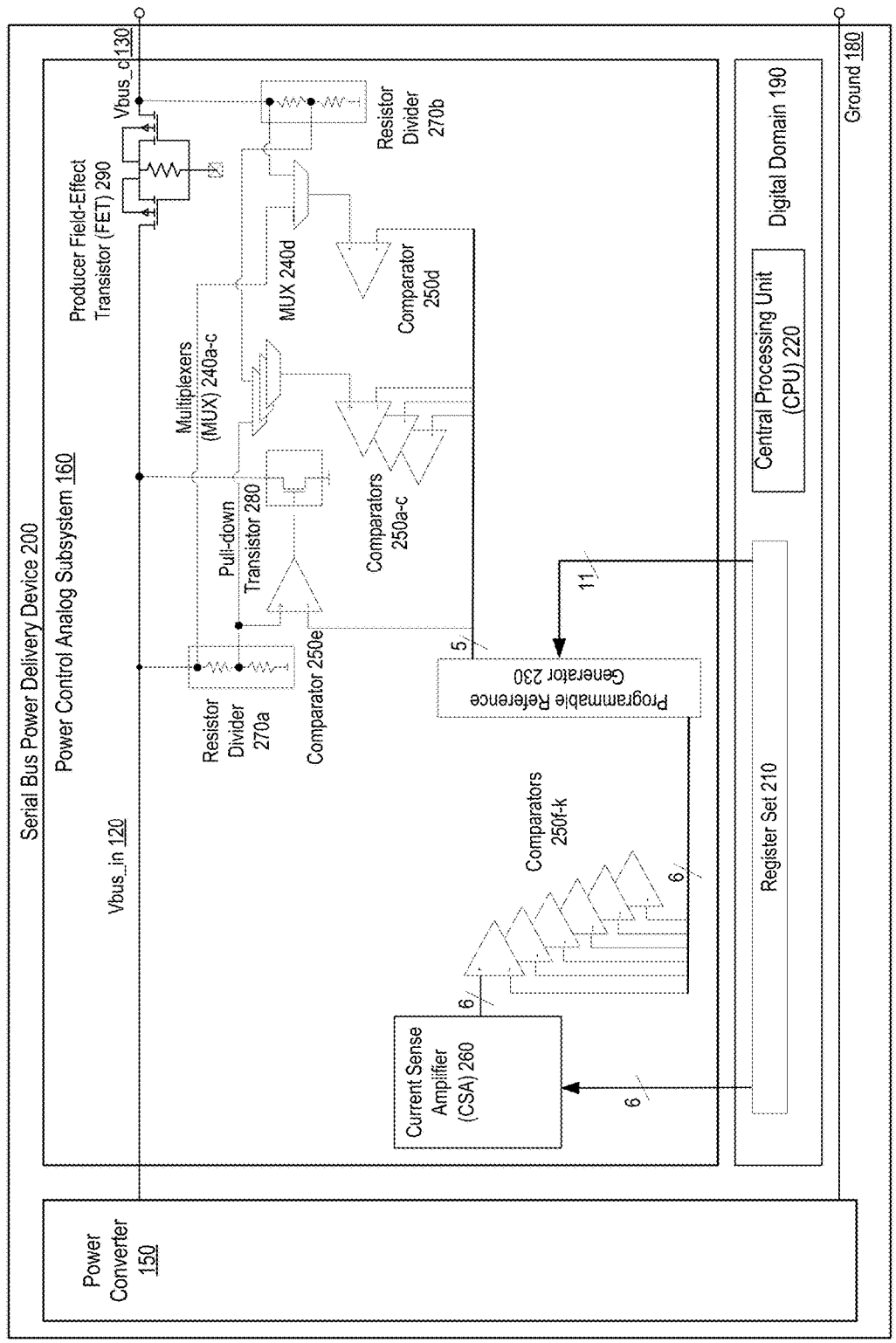
FIG. 2 is a circuit diagram illustrating a serial bus power delivery device, according to some embodiments.

FIG. 2 is a circuit diagram illustrating a serial bus power delivery device 200, according to some embodiments. SBPD device 200 may be similar to SBPD device 110 as described with respect to FIG. 1. For the sake of convenience and clarity, numbers of components used in FIG. 1 are used in the present Figure. SBPD device 200 device includes power converter 150, power control analog subsystem 160, Vbus_in 120, Vbus_c 130, and ground 180. In other embodiments, SBPD device 200 may include the same, more, or fewer components. Power control analog subsystem 160 is illustrated as a discrete device (e.g., IC in its own package and with ouput pins) for purposes of illustration, rather than limitation.

In some embodiments, the SBPD device 200 may include power converter 150, power control analog subsystem 160, and a digital domain 190. The digital domain 190 may include a register set 210 and a central processing unit (CPU) 220. The register set 210 may store register values to program reference voltages. The CPU 220 may be coupled to the register set 210. The CPU 220 may store the register values in the register set 210. The CPU 220 may include inputs, wherein each input is to receive a corresponding system interrupt.

The power control analog subsystem 160 may be coupled to the register set 210 and the CPU 220. The power control analog subsystem 160 may include a programmable reference generator 230, multiplexers 240, comparators 250, current sense amplifier (CSA) 260, resistor dividers 270, and a pull-down transistor 280. In some embodiments, the power control analog subsystem 160 includes a producer field-effect transistor (FET) 290. In some embodiments, the producer FET 290 is external to the power control analog subsystem 160.

The programmable reference generator 230 may generate reference voltages in response to the register values. For example, the programmable reference generator 230 may generate a first reference voltage in response to the first register value, a second reference voltage in response to the second register value, etc. The programmable reference generator 230 may be a common voltage reference signal generator (i.e., may be used to provide multiple types of system interrupts). Each reference voltage may be indicative of a corresponding programmable threshold for a corresponding operation (e.g., first reference voltage is indicative of a first programmable threshold for a first operation, second reference voltage is indicative of a second programmable threshold for a second operation that is different from the first operation, etc.).

Resistor divider 270a may sense a voltage level on a first Vbus power supply (e.g., first voltage, Vbus_in 120). Resistor divider 270b may sense a voltage level on a second Vbus power supply (e.g., second voltage, Vbus_c 130). A first resistor divider 270a may output the Vbus_in 120 and a second resistor divider 120b may output the Vbus_c 130. Each of the multiplexers 240a-d may be coupled to receive a corresponding first value of the Vbus_in 120 from the first resistor divider 270b and a corresponding second value of the Vbus_c 130 from the second resistor divider 270b.

The multiplexers 240 may be analog multiplexers. The multiplexers 240 (e.g., multiplexers 240a-d) may be coupled to a first voltage (e.g., Vbus_in 120, an input voltage) and a second voltage (e.g., Vbus_c 130, an output voltage). Each multiplexer 240 may have a first input coupled to a resistor divider 270a that is coupled to Vbus_in 120, a second input coupled to a resistor divider 270b that is coupled to Vbus_c 130, and an output coupled to a comparator 250. Multiplexers 240a-d may be coupled to a first terminal and a second terminal of the producer FET to receive a first voltage (Vbus_in 120) and a second voltage (Vbus_c 130) and to output a second plurality of reference voltages.

Each of the comparators 250 (comparators 250a-k) may be coupled to receive a corresponding reference voltage from the programmable reference generator 230. Each of the comparators 250 a-d may be coupled to receive a corresponding selected voltage from a corresponding multiplexer of multiplexers 240a-d. Comparators 250a-d may be configured to output a corresponding system interrupt to the CPU 220 based on a corresponding voltage condition. Comparator 250e may be coupled to receive a corresponding reference voltage from the programmable reference generator 230 and to receive a first voltage from the resistor divider 270a that is coupled to Vbus_in 120. Comparators 250f-k (e.g., at least three comparators) may be coupled to receive a corresponding reference voltage from the programmable reference generator 230 and to receive a corresponding output voltage from the CSA 260. As will be further described in the following figures, comparators 250a-k may provide operations or functions (e.g., interrupt functions, etc.).

In some embodiments, the programmable reference generator 230 is used to provide an operation or function via each of the comparators 250a-k. In some embodiments, the programmable reference generator 230 is used to provide more operations or functions than the number of comparators 250a-k (e.g., via more components than the comparators 250a-k). In some embodiments, the programmable reference generator 230 is used to provide fewer operations or functions (e.g., UV, OV, and OCP) than the number of comparators 250a-k. The consolidated reference source (i.e., programmable reference generator 230) may minimize device area and may provide for flexibility (e.g., reduce need for multiple circuits with different characteristics). An array of comparators 250 may enable simultaneous monitoring of voltage and current in the SBPD device 200 (e.g., the array of comparators may enable simultaneous monitoring of voltage and current in a USB-PD device). An array of analog MUXes may enable the SBPD device 200 to be used in various USB-PD applications. The power control analog subsystem 160 may include two independent input reference voltage signals (e.g., Vbus_in 120 and Vbus_c 130) and a CSA 260.

In some embodiments, a single reference voltage is routed to various functional blocks. Each block may have a reference generator and programming options. In some embodiments, all analog signals may be converted to digital and all filtering and comparator functions may be performed in the digital realm (e.g., a programmable reference generator 230 may not be needed). In some implementations, all input signals may be connected to any comparator 250 (e.g., to create a fully programmable cross switch). In some embodiments, the SBPD device 200 may be applied to any power adapter system (e.g., not just USB-PD power adapters).

Figure 3:
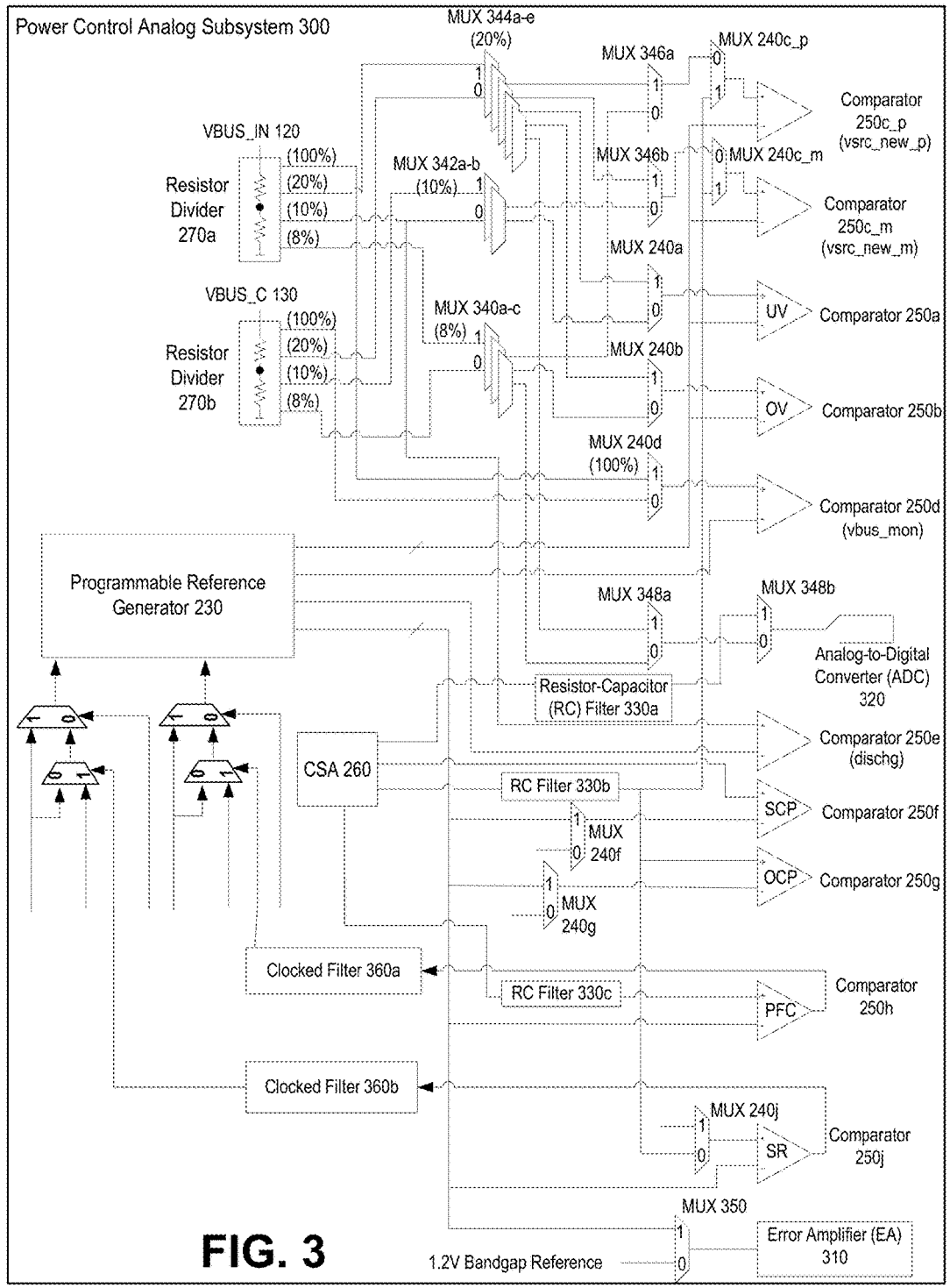
FIG. 3 is a circuit diagram illustrating a power control analog subsystem, according to some embodiments.

FIG. 3 is a circuit diagram illustrating a power control analog subsystem 300, according to some embodiments. Power control analog subsystem 300 may include some similar components as power control analog subsystem 160 as described with respect to FIGS. 1-2. For the sake of convenience and clarity, some components used in FIGS. 1-2 are used in the present Figure.

Conceptually, power control analog subsystem 300 works similarly to power control analog subsystem 160 of FIGS. 1-2. Multiple connection paths may enable the power control analog subsystem 300 to adjust to multiple applications. Various voltage levels may be supported at inputs using different MUX cell types (e.g., 20V, 5V).

The power control analog subsystem 300 may include a programmable reference generator 230, MUXes (e.g., MUX 240a-k, MUX 340a-c, MUX 342a-b, MUX 344a-e, MUX 346a-b, MUX 348a-b, MUX 350, etc.), comparators 250a-k, resistor dividers 270a-b, error amplifier (EA) 310, analog-to-digital converter (ADC) 320, resistor-capacitor (RC) filters 330a-c, and logic or clocked filters 360a-b. The clocked filters 360a-b may pass pulses that meet a threshold length (e.g., pass only pulses that are sufficiently long enough). The clocked filters 360a-b may act like RC filters, but occupy less area than an RC filter. The clocked filters 360a-b may use a clock to implement internal counters.

The power control analog subsystem 300 may be coupled to comparators 250a-k and error amplifier (EA) 310.

Resistor divider 270a may receive an input of Vbus_in 120 and may output different voltages (e.g., 100% percent of Vbus_in 120, 20% percent of Vbus_in 120, 10% percent of Vbus_in 120, and 8% percent of Vbus_in 120). Resistor divider 270b may receive an input of Vbus_c 130 and may output different voltages (e.g., 100% percent of Vbus_c 130, 20% percent of Vbus_c 130, 10% percent of Vbus_c 130, and 8% percent of Vbus_c 130).

MUX 340a-c may receive a first voltage (e.g., 8% percent of Vbus_in 120) from resistor divider 270a and a second voltage (e.g., 8% percent of Vbus_c 130) from resistor divider 270b.

MUX 342a-b may receive a first voltage (e.g., 10% percent of Vbus_in 120) from resistor divider 270a and a second voltage (e.g., 10% percent of Vbus_c 130) from resistor divider 270b.

MUX 344a-e may receive a first voltage (e.g., 20% percent of Vbus_in 120) from resistor divider 270a and a second voltage (e.g., 20% percent of Vbus_c 130) from resistor divider 270b.

MUX 346a may receive a selected voltage from MUX 344a (e.g., 20% Vbus_in 120 or 20% Vbus_c 130) and a selected voltage from MUX 340a (e.g., 8% Vbus_c 130 or 8% Vbus_c 130). MUX 346b may receive a selected voltage from MUX 344b (e.g., 20% Vbus_in 120) and an output voltage from MUX 342a (e.g., 10% Vbus_in 120).

MUX 348a may receive a selected voltage from MUX 344e (e.g., 20% Vbus_in 120 or 20% Vbus_c 130) and a selected voltage from MUX 340c (e.g., 8% Vbus_c 120 or 8% Vbus_c 130). MUX 348b may receive an output voltage from CSA 260 (e.g., via RC filter 330a) and from MUX 348a. ADC 320 may receive an output voltage from MUX 348b.

MUX 350 may receive a reference voltage from the programmable reference generator 230 and a 1.2V bandgap reference voltage. EA 310 may receive an output voltage from the MUX 350.

Over-voltage (OV) and under-voltage (UV) detection may be provided by comparators 250a-b. OV and UV detection may be at voltages ranging from 2V to 25V on either Vbus pin (i.e., Vbus_in or Vbus_c).

Comparator 250a may be coupled to receive a first reference voltage from the programmable reference generator 230 and to receive a first selected voltage from MUX 240a. MUX 240a may receive a selected voltage from MUX 344c (e.g., that receives 20% Vbus_in 120 from resistor divider 270a and 20% Vbus_c 130 from resistor divider 270b) and from MUX 342b (e.g., that receives 10% Vbus_in 120 from resistor divider 270a and 10% Vbus_c 130 from resistor divider 270b). Comparator 250a may output a UV system interrupt based on determining that one or more of the Vbus_in 120 or the Vbus_c 130 meets a first voltage condition (e.g., is less than a first minimum threshold voltage).

Comparator 250b may be coupled to receive a second reference voltage from the programmable reference generator and to receive a second selected voltage from MUX 240b. MUX 240b may receive a selected voltage from 344d (e.g., that receives 20% Vbus_in 120 from resistor divider 270a and that receives 20% Vbus_c 130 from resistor divider 270b) and a selected voltage from MUX 340b (e.g., that receives 8% Vbus_in 120 from resistor divider 270a and that receives 8% Vbus_c 130 from resistor divider 270b). Comparator 250b may output an OV system interrupt based on determining that one or more of the Vbus_in 120 or the Vbus_c 130 meets a second voltage condition (e.g., is greater than a second maximum threshold voltage).

Monitoring of Vbus_c 130 may be provided by comparator 250d. Vbus_c monitor sensing may be at 0.8V from either Vbus pin at Type-C attach (determine whether Vbus_in 120 or Vbus_c 130 is greater than 0.8V).

Comparator 250d may be coupled to receive a third reference voltage from the programmable reference generator and to receive a third selected voltage from MUX 240d. MUX 240d may receive the first Vbus_in 120 (e.g., at 100%) and the Vbus_c 130 (e.g., at 100%). Comparator 250d may be configured to output a Vbus monitor system interrupt based on determining that one or more of the first voltage or the second voltage meets a third voltage condition (e.g., is greater than a third threshold voltage (e.g., 0.8V)).

Programmable Vbus_in discharge control may be provided by comparator 250e and pull-down transistor 280 (see FIG. 2). Comparator 250e may stop pull-down when a target voltage is reached.

Comparator 250e may be coupled to receive a fourth reference voltage from the programmable reference generator 230 and to receive the Vbus_in 130 (e.g., at 10% Vbus_in 130) from the first resistor divider. Comparator 250e may be configured to discharge the Vbus_in 120 based on determining that the Vbus_in 120 meets a fourth voltage condition (e.g., based on determining that the SBPD device 110 is shutdown, based on determining that a target voltage is met).

Short-circuit protection (SCP) and over-current protection (OCP) may be provided via comparators 250*f* and 250*g* (e.g., providing of SCP and OCP, over-current detection and short-circuit detection). OCP and SCP may be provided using the same or independent references sources (e.g., bandgap (BG) reference, deep sleep (DS) reference) at various, user defined levels.

Comparator 250*f* may be coupled to receive a fifth reference voltage from the programmable reference generator 230 and to receive a fifth output voltage from the CSA 260. Comparator 250*f* may be configured to output a SCP system interrupt based on determining that the fifth output voltage meets a fifth voltage condition (e.g., is greater than a fifth threshold voltage).

Comparator 250*g* may be coupled to receive a sixth reference voltage of from the programmable reference generator 230 and to receive a sixth output voltage from the CSA 260. Comparator 250*g* may be configured to output an OCP system interrupt based on determining that the sixth output voltage meets a sixth voltage condition (e.g., is greater than a sixth threshold voltage).

Power factor correction (PFC) and synchronous rectification (SR) may be provided by comparators 250*f-k*. Simultaneous PFC and SR may be provided at various, user-defined levels.

Comparator 250*h* may be coupled to receive a seventh reference voltage from the programmable reference generator 230 and to receive a seventh output voltage from CSA 260. Comparator 250*h* may be configured to output a PFC system interrupt (e.g., to enable PFC) based on determining that a seventh voltage condition is met. Clocked filter 360*a* may receive an output from comparator 250*h* in response to the corresponding threshold being met.

Comparator 250*i* may be coupled to receive an eighth reference voltage from the programmable reference generator 230 and to receive an eighth output voltage from CSA 260. Comparator 250*i* may be configured to output a PFC system interrupt (e.g., to disable PFC) based on determining an eighth voltage condition is met. A corresponding clocked filter may receive output from comparator 250*i* in response to the eighth voltage condition being met.

Comparator 250*j* may be coupled to receive a ninth reference voltage from the programmable reference generator 230 and to receive a ninth output voltage from a CSA 260. Comparator 250*j* may be configured to output a SR system interrupt (e.g., to enable SR) based on determining that a ninth voltage condition is met. Clocked filter 360*b* may receive an output from comparator 250*j* in response to a ninth voltage condition being met.

Comparator 250*k* may be coupled to receive a tenth reference voltage from the programmable reference generator 230 and to receive a tenth output voltage from a CSA 260. Comparator 250*k* may be configured to output a SR system interrupt (e.g., to disable SR) based on determining that a tenth voltage condition is met. A corresponding clocked filter may receive an output from comparator 250*k* in response to a tenth voltage condition being met.

Monitoring of Vbus_in 120 and Vbus_c 130 voltages may be provided by ADC 320. ADC 320 may be coupled to receive an output from MUX 348*b*. MUX 348*b* may be coupled to receive an output from CSA 260 (e.g., via RC filter 330*a*) and a selected voltage from MUX 348*a*. MUX 348*a* may receive a selected voltage from MUX 344*e* (e.g., that receives 20% of Vbus_in 120 and 20% of Vbus_c 130) and a selected voltage from MUX 340*c* (e.g., that receives 8% of Vbus_in 120 and 8% of Vbus_c 130).

Additional monitoring of Vbus_in 120 or Vbus_c 130 voltage levels to control power supply transitions (e.g., vsrc_new_p, vsrc_new_m) may be provided by comparators 250*c_p* and 250*c_m*. Comparators 250*c_p* and 250*c_m* may determine if the voltage has gone over a threshold voltage or reached a threshold voltage range.

Comparator 250*c_p* may be coupled to receive a corresponding reference voltage from the programmable reference generator and to receive a third selected voltage from MUX 240*c* p. MUX 240*c_p* may receive a selected voltage from MUX 346*a* and an output voltage from CSA 260 (via RC filter 330*b*). MUX 346*a* may receive a selected voltage from MUX 344*a* (e.g., that receives 20% of Vbus_in 120 and 20% of Vbus_c 130) and a selected voltage from MUX 340*a* (e.g., that receives 8% of Vbus_in 120 and 8% of Vbus_c 130). Comparator 250*c_p* may be configured to output a voltage source (Vsrc) system interrupt based on determining that one or more of the Vbus_in 120 or the Vbus_c 130 meets a corresponding voltage condition (e.g., is within a corresponding range of values).

Comparator 250*c_m* may be coupled to receive a corresponding reference voltage from the programmable reference generator and to receive a selected voltage from MUX 240*c_m*. MUX 240*c_m* may receive a selected voltage from MUX 346*b* and an output voltage from CSA 260 (via RC filter 330*b*). MUX 346*b* may receive a selected voltage from MUX 344*b* (e.g., that receives 20% of Vbus_in 120 and 20% of Vbus_c 130) and a selected voltage from MUX 342*a* (e.g., that receives 10% of Vbus_in 120 and 10% of Vbus_c 130). Comparator 250*c_p* may be configured to output a Vsrc system interrupt based on determining that one or more of the Vbus_in 120 or the Vbus_c 130 meets a corresponding voltage condition (e.g., is within a corresponding range of values).

EA 310 may be coupled to receive a selected output from MUX 350. MUX 350 may be coupled to receive a corresponding reference voltage from the programmable reference generator 230 and to receive a 1.2V reference (e.g., a substitute 1.2V reference). In one embodiment, the 1.2V reference is based on the 1.2V bandgap reference. In another embodiment, the 1.2V reference is based on a 0.74V deep sleep reference.

Figure 4A:
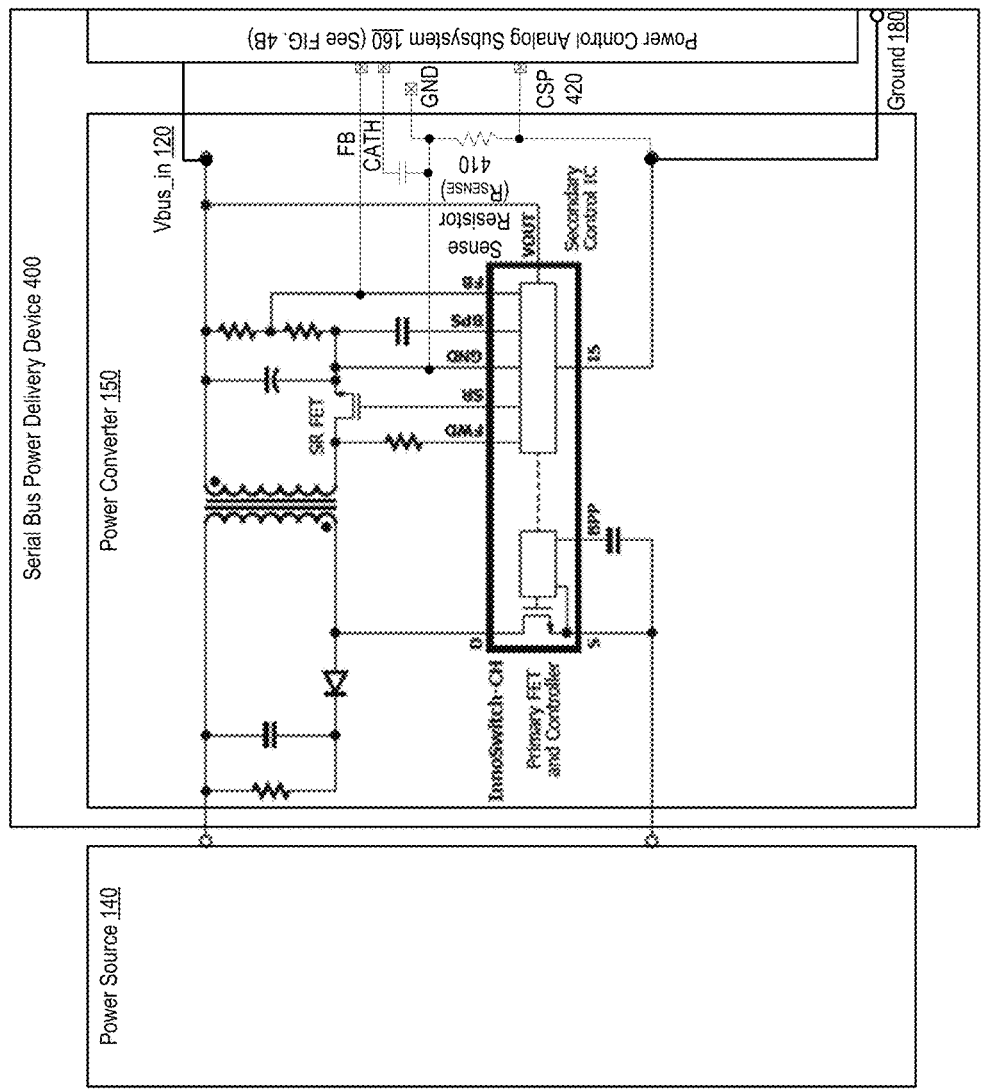
FIGS. 4A-4B is a circuit diagram illustrating the serial bus power delivery device, according to some embodiments.
Figure 4B:
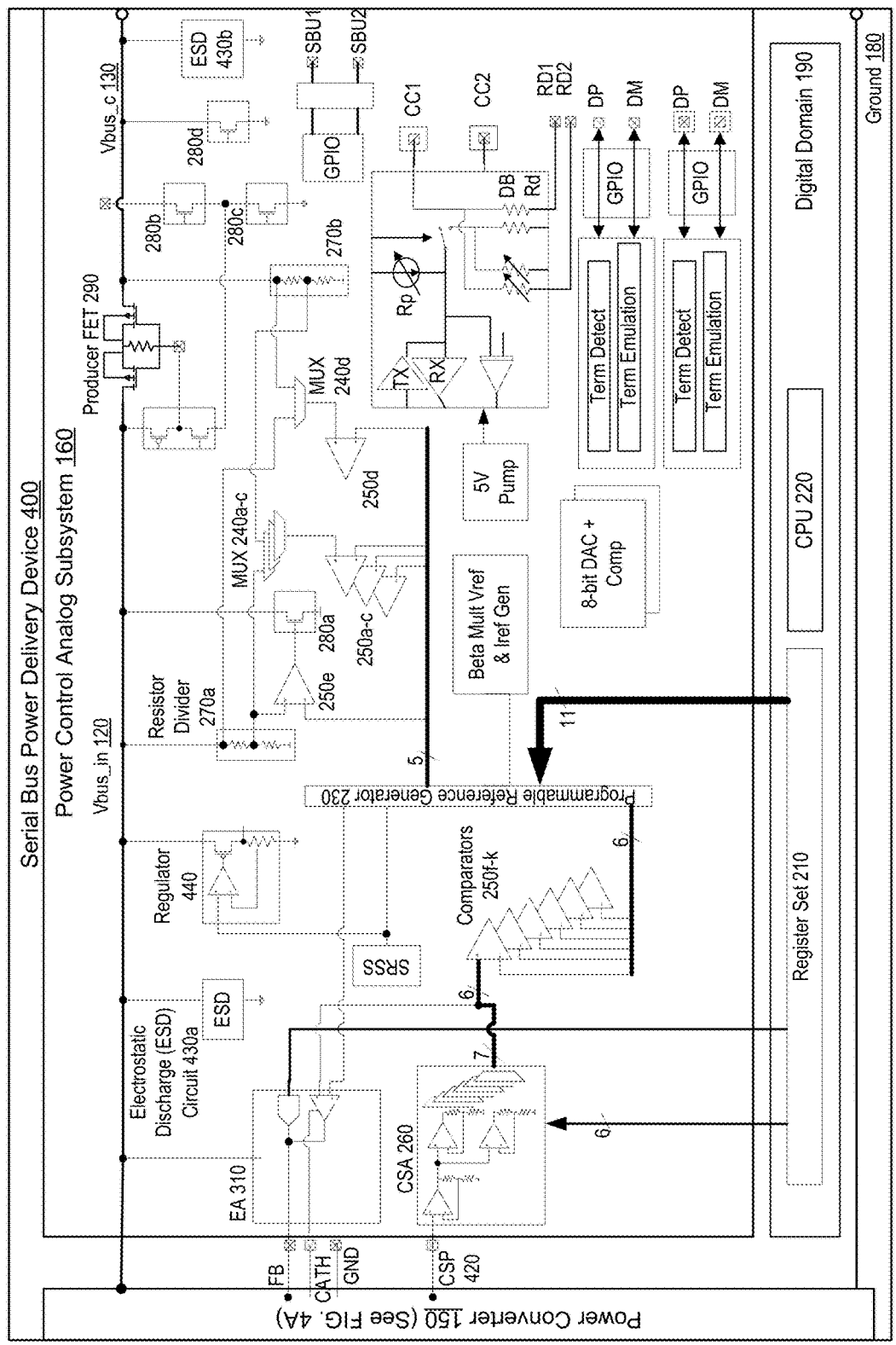

FIGS. 4A-4B is a circuit diagram illustrating the serial bus power delivery device 400, according to some embodiments. SBPD device 400 may include some similar components as SBPD device 110 and 200 as described with respect to FIGS. 1-2. For the sake of convenience and clarity, some components used in FIGS. 1-2 are used in the present Figures.

Conceptually, SBPD device 400 works similarly to SBPD device 110 and 200 of FIGS. 1-2.

The SBPD device 400 may include a power converter 150 and a power control analog subsystem 160. The power converter may be coupled to the power source 140.

The power converter 150 may provide the Vbus_in 120 to the power control analog subsystem. The power converter may have a sense resistor (Rsense) 410 that is to convert Vbus_in 130 into a CSA voltage (e.g., current sense positive (CSP) 420. CSP 420 may be a voltage that is smaller than Vbus_in 120 and is to be amplified by the CSA 260. The CSA 260 may be coupled to receive the CSP 420 from the Rsense 410 and to receive a set of register values (e.g., six register values) from the register set 210. The CSA 260 may output a set of output values (e.g., seven output values), a corresponding output value for each of comparators 250*f-k* and a corresponding output value for the EA 310.

The EA 310 may be coupled to receive a register value from the register set 210, to receive a corresponding reference voltage from the programmable reference generator 230, and Vbus_in 120. The EA 310 may output FB and CATH to the power converter 150.

The power control analog subsystem 160 may include one or more electrostatic discharge (ESD) circuits 430 (e.g., ESD 430a-b) coupled to the Vbus_in 120. The power control analog subsystem 160 may include one or more pull-down transistors 280 (e.g., pull down transistors 280a-d) coupled to the Vbus_in 120. The power control analog subsystem 160 may include a regulator 440 coupled to the Vbus_in 120. Regulator 440 may provide an internal power supply for the power control analog subsystem 160 (e.g., regulator 440 may provide 3-5V and Vbus_in 120 may be 3-20V).

Figure 5:
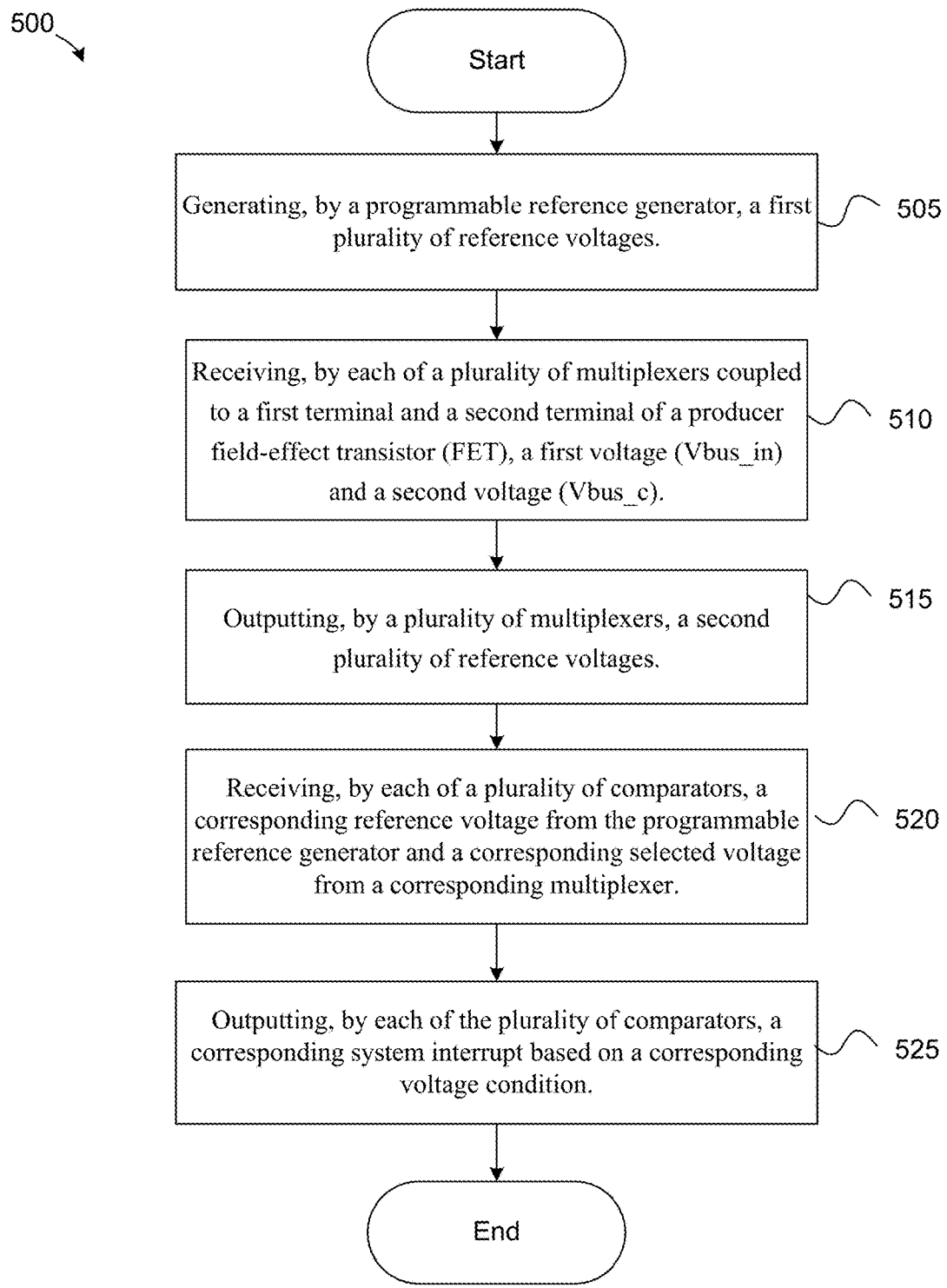
FIG. 5 illustrates a flow diagram of a method of providing multiple interrupt functions using a common programmable reference generator, according to another embodiment.

FIG. 5 illustrates a flow diagram of a method of providing multiple interrupt functions using a common programmable reference generator, according to another embodiment. The method 500 may be performed by processing logic that comprises hardware (e.g., circuitry, dedicated logic, programmable logic, microcode, etc.). In some embodiments, the method 500 is performed wholly or in part by SBPD device 110, 200. In some embodiments, the method 500 is performed by power control analog subsystem 160 or 300. In some embodiments, the method 500 is performed by the programmable reference generator 230, the multiplexers 240, and the comparators 250.

Method 500 begins at block 505 where processing logic performing the method generates, by a programmable reference generator 230, a first plurality of reference voltages. At block 510, processing logic receives, by each of a plurality of multiplexers coupled to a first terminal and a second terminal of producer FET 290, a first voltage (Vbus_in) and a second voltage (Vbus_c). At block 515, processing logic outputs, by a plurality of multiplexers (e.g., multiplexers 240a-d), a second plurality of reference voltages. At block 520, processing logic receives, by each of a plurality of comparators (e.g., comparators 250a-d), a corresponding reference voltage of the first plurality of reference voltages from the programmable reference generator 230, and a corresponding selected voltage of the second plurality of reference voltages from a corresponding multiplexer of the plurality of multiplexers (e.g., multiplexers 240a-d). At block 525, processing logic outputs, by each of the plurality of comparators (e.g., comparators 250a-d), a corresponding system interrupt based on a corresponding voltage condition.

In some embodiments, the method 500 is performed by the programmable reference generator 230, the multiplexers 240, and the comparators 250. At block 505, the programmable reference generator 230 generates a first plurality of reference voltages. At block 510 the multiplexers 240 (e.g., multiplexers 240a-d) output a second plurality of reference voltages. At block 515, each of a plurality of comparators 250 (e.g., comparators 250a-d) receives a corresponding reference voltage of the first plurality of reference voltages from the programmable reference generator 230 and a corresponding selected voltage of the second plurality of reference voltages from a corresponding multiplexer 240 of the plurality of multiplexers (e.g., multiplexers 240a-d). At block 520, each of the plurality of comparators 250 (e.g., comparators 250a-d) outputs a corresponding system interrupt based on a corresponding voltage condition.

Figure 6:
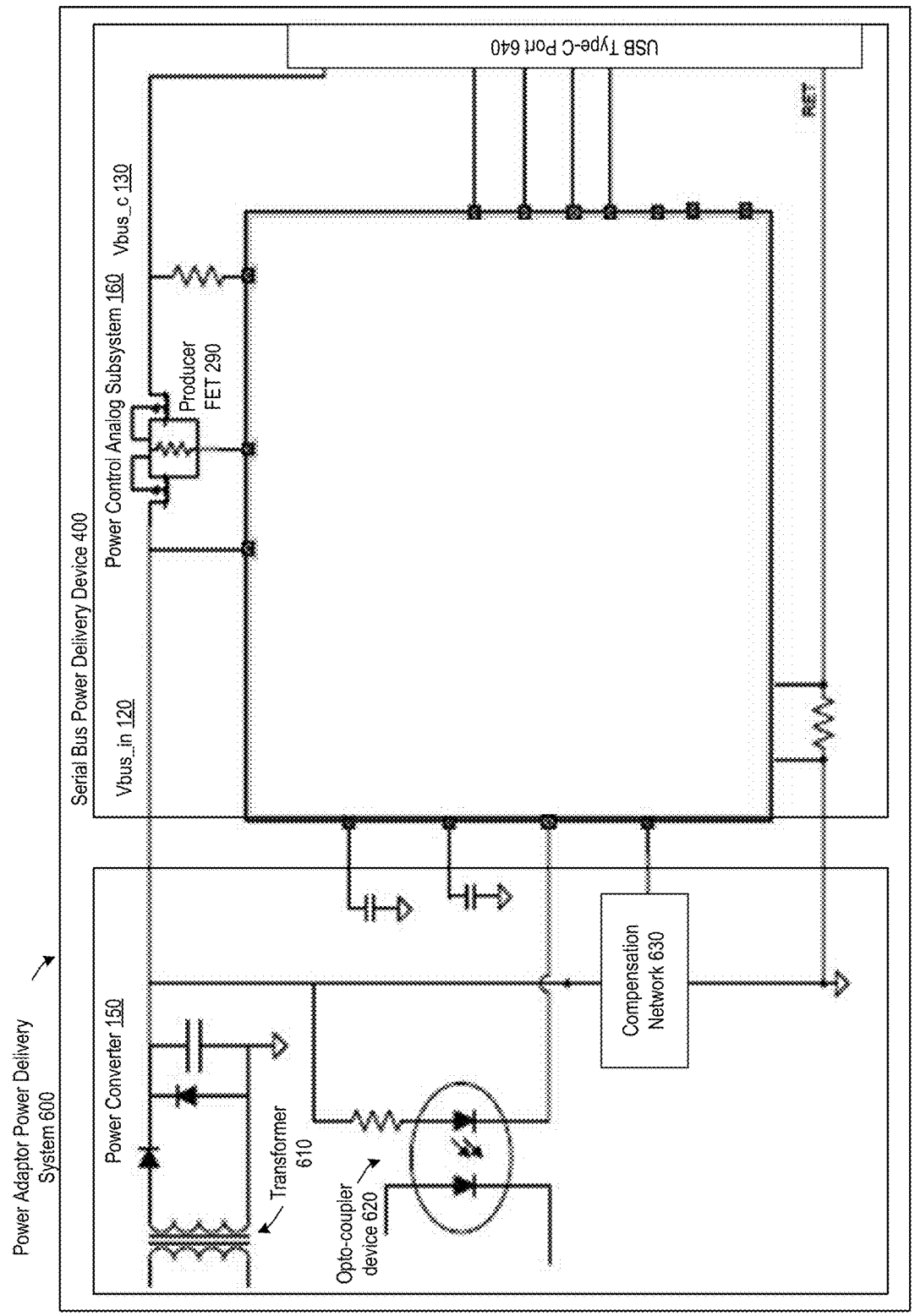
FIG. 6 is a circuit diagram illustrating a power adaptor power delivery system, according to some embodiments.

FIG. 6 is a circuit diagram illustrating a power adaptor power delivery system 600, according to some embodiments. The power converter may include a transformer 610, an opto-coupler device 620, and a compensation network 630. The power control analog subsystem 160 may include a USB Type-C™ Port 640. The power control analog subsystem 160 may control a power adapter (e.g., the power control analog subsystem 160 may control the source DC voltage by sending a feedback signal via an opto-coupler device 620 to a primary transformer control (not shown). Voltages on boths sides of the Producer FET 290 (e.g., Vbus_in 120 and Vbus_c 130) may be monitored for state of the voltages to determine appropriate control modes. In some embodiments, the power control analog subsystem 160 includes the producer FET 290. In some embodiments, the producer FET 290 is external to the power control analog subsystem 160. The power control analog subsystem 160 may include a CSA 260 and the CSA 260 may be used to monitor the current drawn by any device connected to the USB Type-C™ port 640 (e.g., the Type-C connector).

Figure 7:
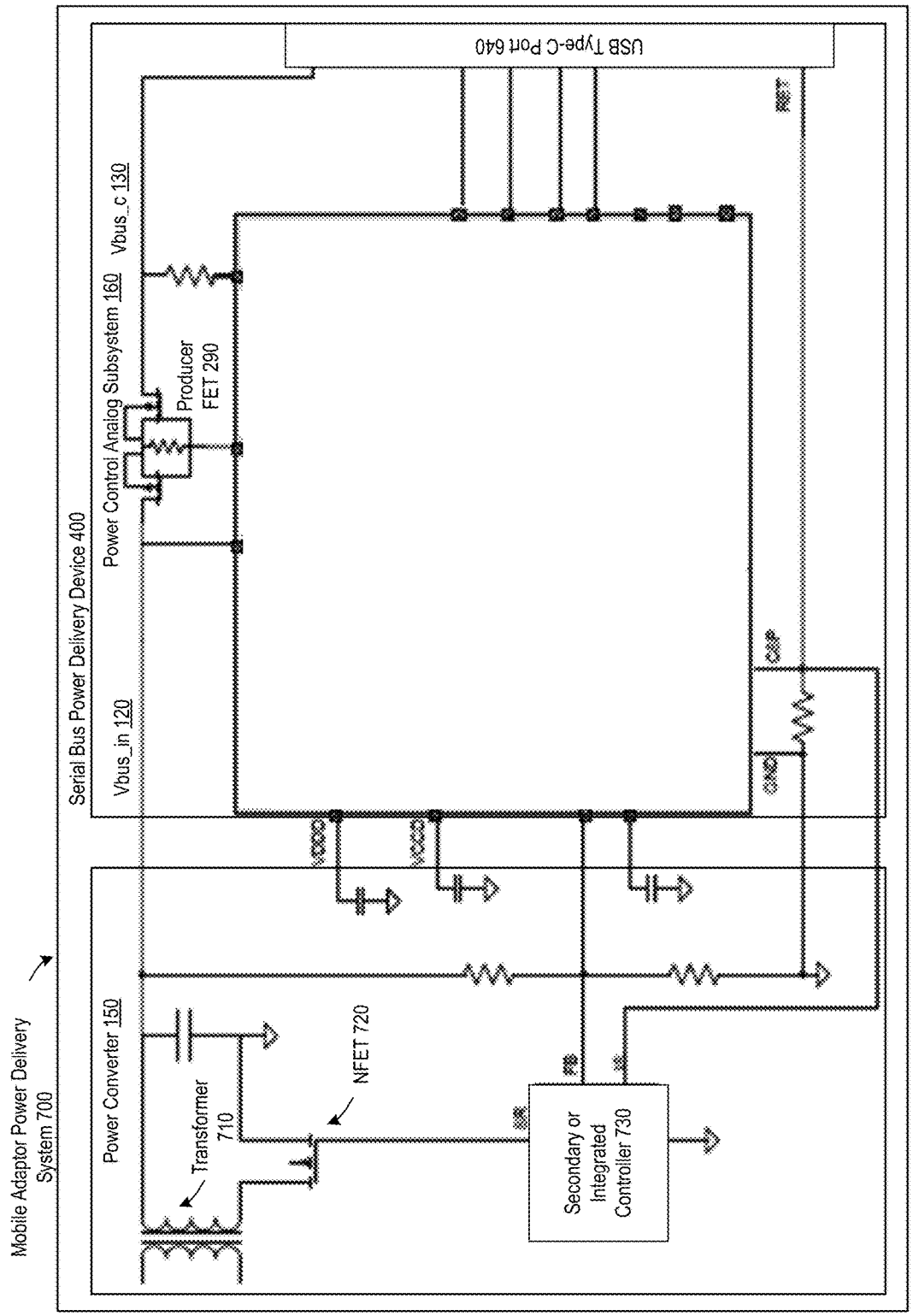
FIG. 7 is a circuit diagram illustrating a mobile adaptor power delivery system, according to some embodiments.

FIG. 7 is a circuit diagram illustrating a mobile adaptor power delivery system 700, according to some embodiments. The mobile adaptor power delivery system 700 may include direct feedback control. An external integrated circuit (IC) (e.g., power control analog subsystem 160) may be used to control a primary side of the transformer 710 (e.g., adapter transformer). The external IC may have the ability to control a synchronous recitfication (SR) mechanism shown by the NFET 720 (e.g., n-type JFET transistor, junction field effect transistor of n-type) connected to a secondary winding of the transformer 710 (e.g., that replaces the diodes shown in FIG. 6).

Figure 8:
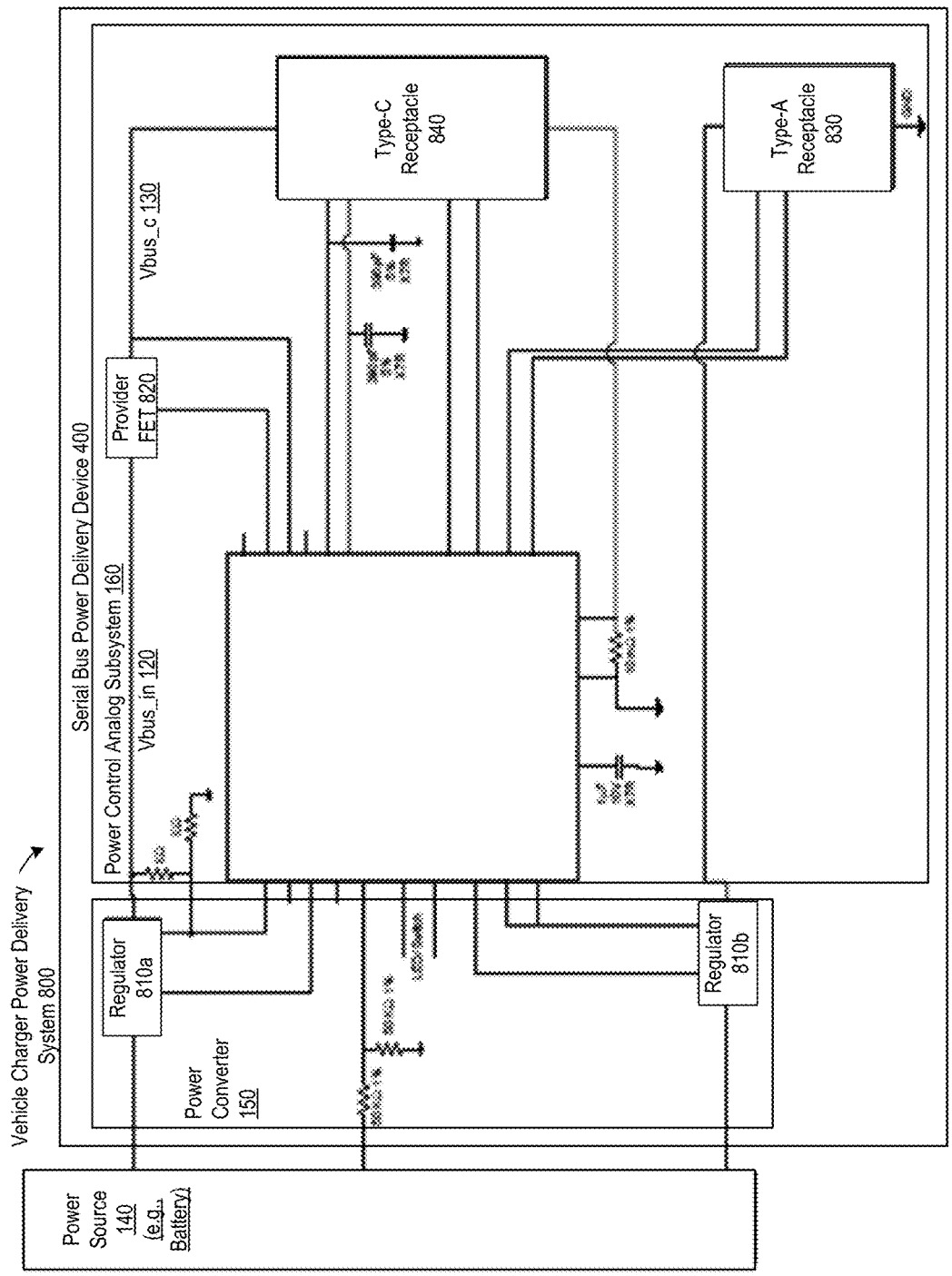
FIG. 8 is a circuit diagram illustrating a vehicle charger power delivery system, according to some embodiments.

FIG. 8 is a circuit diagram illustrating a vehicle charger power delivery system 800, according to some embodiments. In some embodiments, the vehicle charger power delivery system 800 is a Type-C/Type-A vehicle charger. The vehicle charger power delivery system 800 may include a power converter 150 and a power control analog subsystem 160. The power converter 150 may include a regulator 810a and a regulator 810b that are coupled to the power source 140 and to the power control analog subsystem 160. The power control analog subsystem 160 may include a provider FET 820, a Type-A receptacle 830, and a type-C receptacle 840. In some embodiments, the power control analog subsystem 160 includes the provider FET 820. In some embodiments, the provider FET 820 is external to the power control analog subsystem 160. The serial bus power delivery device 400 may acts as a power controller when connected to a battery source (e.g., power source 140) (e.g., instead of an adapter). The power source 140 provides power that can be drawn by a Type-C sink device (e.g., sink device 170) via Type-C receptacle 840.

Figure 9A:
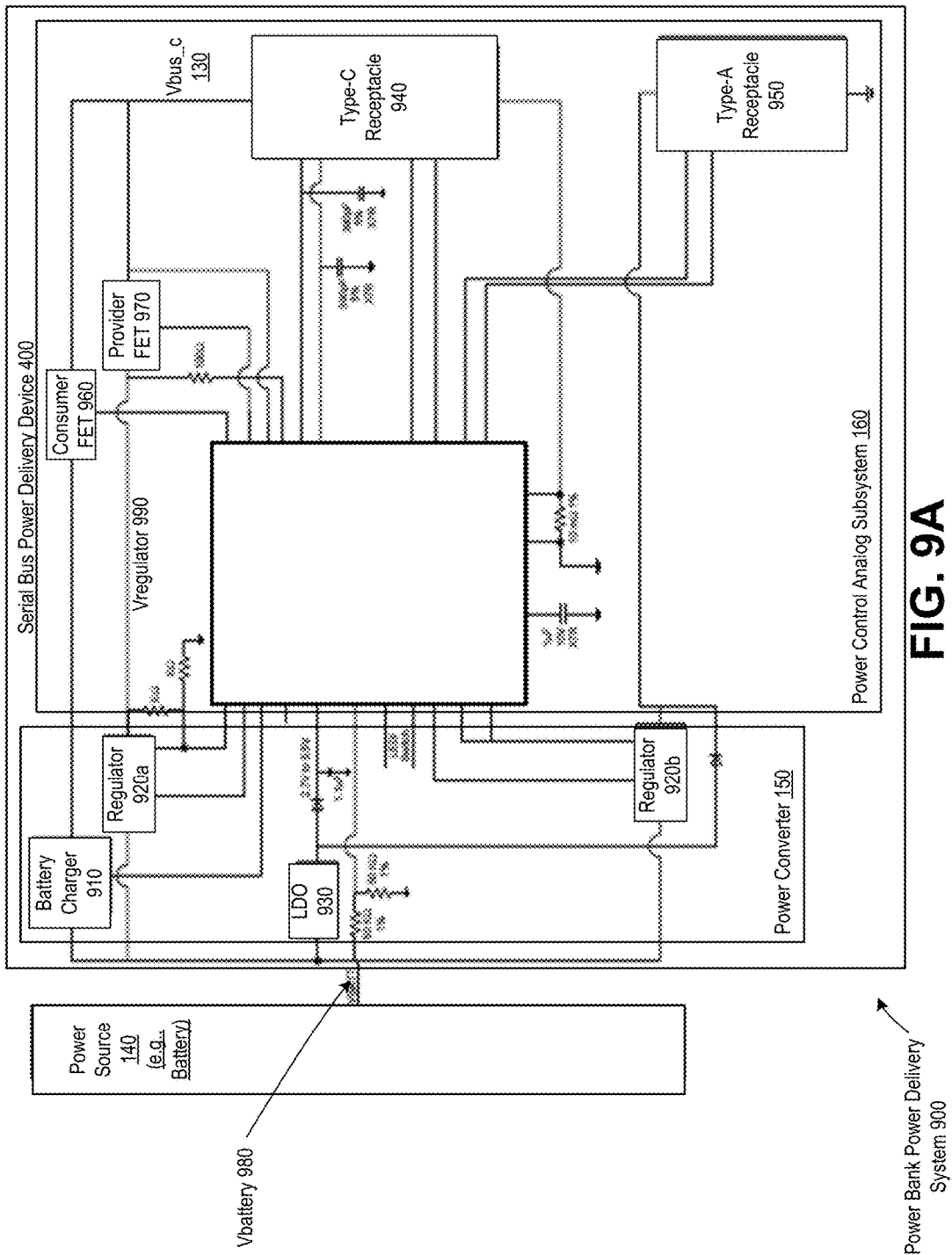
FIG. 9A is a circuit diagram illustrating a power bank power delivery system, according to some embodiments.

FIG. 9A is a circuit diagram illustrating a power bank power delivery system 900, according to some embodiments. The power bank power delivery system 900 may include a power source 140 (e.g., battery), a power converter 150, and a power control analog subsystem 160. The power source 140 may provide a battery voltage (e.g., Vbattery 980). The power converter 150 may include a battery charger 910, a regulator 920a, and a regulator 920b. In some embodiments, the power converter 150 includes a low-dropout linear regulator (LDO) 930. The power control analog subsystem 160 may include a Type-C receptacle 940, a Type-A receptacle 950, a consumer FET 960, and a provider FET 970. In some embodiments, the power control analog subsystem 160 includes consumer FET 960 and/or the provider FET 970. In some embodiments, the consumer FET 960 and/or the provider FET 970 is external to the power control analog subsystem 160.

The power bank power delivery system 900 illustrates how the power control analog subsystem 160 can be positioned on either side of the Type-C cable. The power bank power delivery system 900 may monitor the power supply states. In response to being positioned on the "sink" side of the cable, the power source 140 (e.g., battery) can be charged. In response to being positioned on the "source" side of the cable, the power source 140 (e.g., battery) can supply power.

Figure 9B:
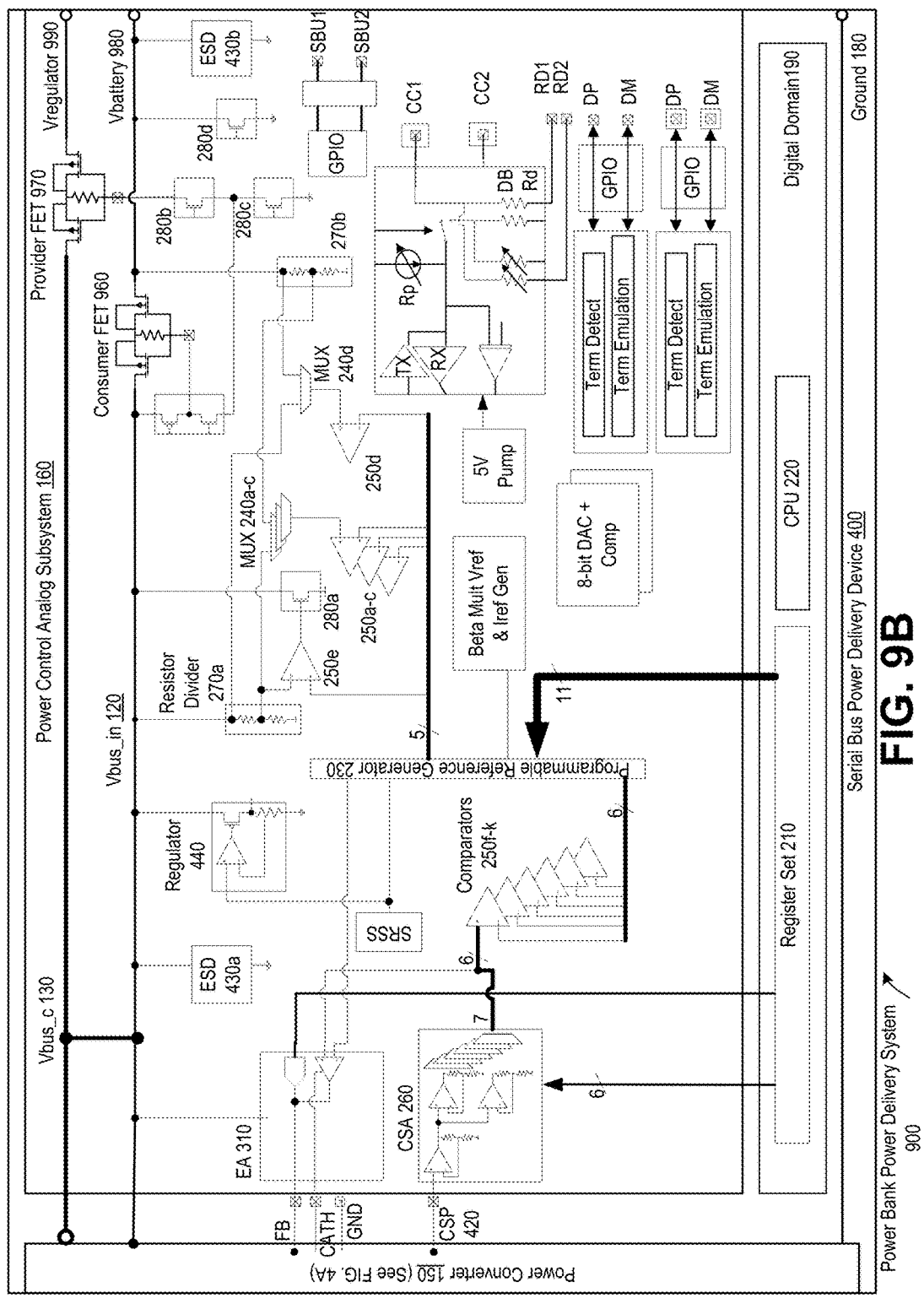
FIG. 9B is a circuit diagram illustrating a power bank power delivery system, according to some embodiments.

FIG. 9B is a circuit diagram illustrating a power bank power delivery system 900, according to some embodiments. FIG. 9B illustrates power control analog subsystem 160 including Vbus_in 120, Vbus_c 130, Vbattery 980, and Vregulator 990. The power control analog subsystem 160 also includes consumer FET 960 and provider FET 970. In some embodiments, the power control analog subsystem 160 includes consumer FET 960 and/or the provider FET 970. In some embodiments, the consumer FET 960 and/or the provider FET 970 is external to the power control analog subsystem 160.

Figure 10:
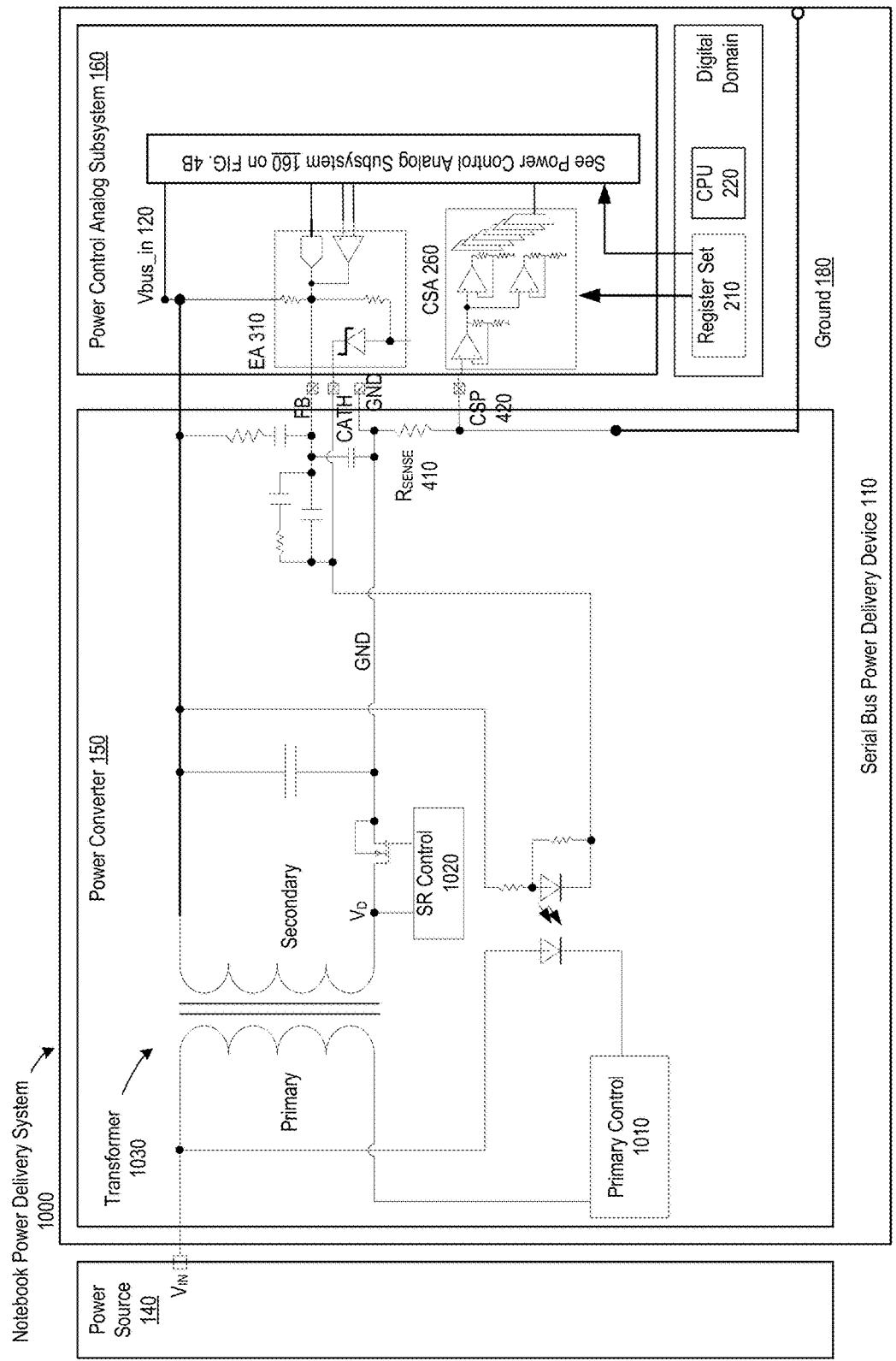
FIG. 10 is a circuit diagram illustrating a notebook power delivery system, according to some embodiments.

FIG. 10 is a circuit diagram illustrating a notebook power delivery system 1000, according to some embodiments. The notebook power delivery system 1000 may include a power source 140 and a SBPD device 110. The SBPD device 110 may include a power converter 150, a power control analog subsystem 160, and a digital domain 190. The power converter 150 may include a transformer 1030, a primary control 1010, and a SR control 1020 (e.g., secondary control).

Figure 11:
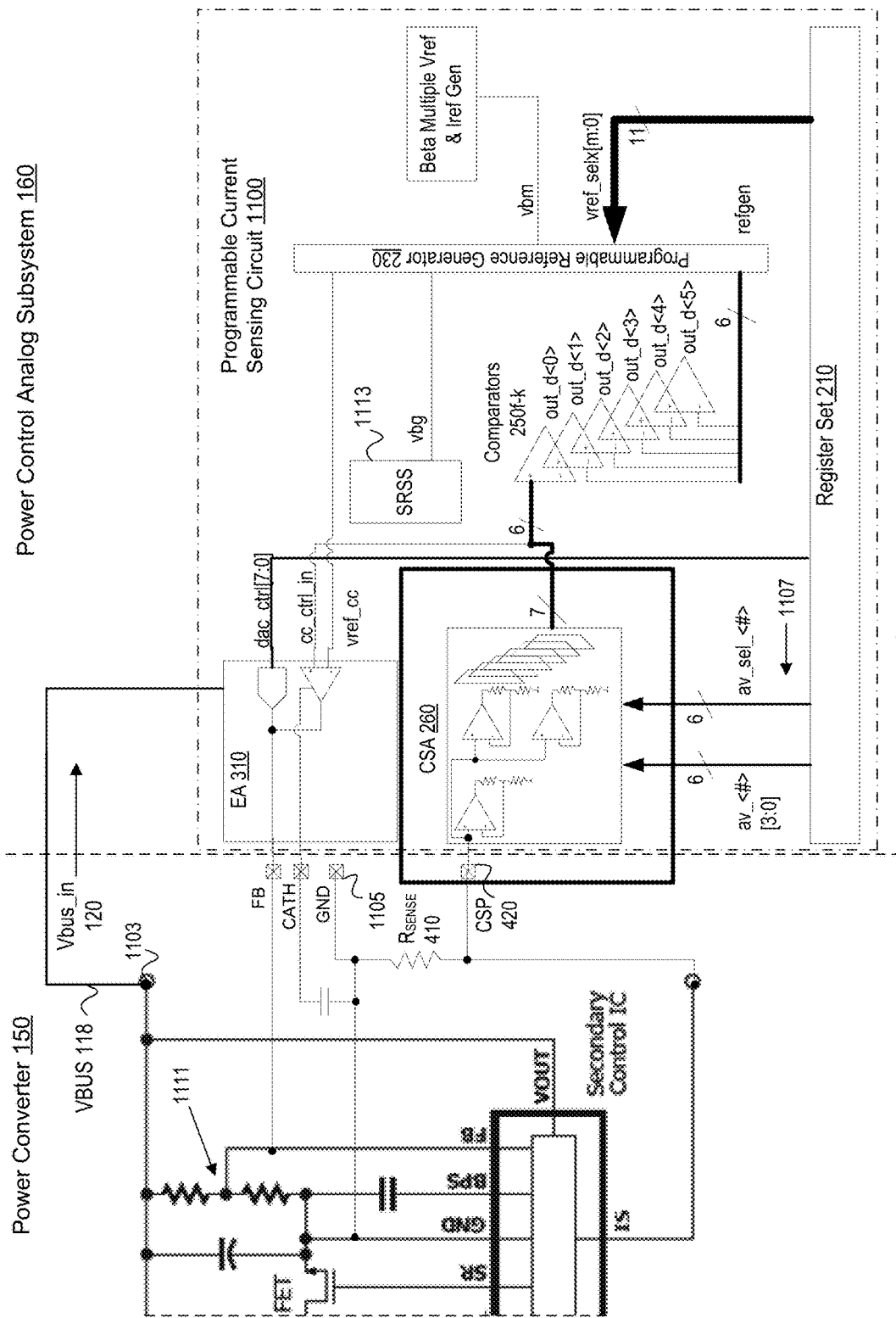
FIG. 11 is a circuit diagram illustrating a programmable current sensing circuit, according to some embodiments.

FIG. 11 is a circuit diagram illustrating a programmable current sensing circuit 1100, according to some embodiments. The power converter 150 that is also illustrated represents a chip that performs primary and secondary control of power supply bus (VBUS) 118 in power systems, with particular emphasis herein to the USB compatible power supply device 110 of FIG. 1. The power control analog system 160 may provide circuitry to monitor the Vbus_in 120 power supply voltage (e.g., the VBUS signal), trigger system interrupts in response to certain current levels, and to provide analog feedback that enables continuous current control of the Vbus_in 120. The power control analog system 160 may include the programmable current sensing circuit 1100, which may be coupled to the power converter 150.

In various embodiments, the programmable current sensing circuit 1100 may include the current sense resistor (Rsense) 410 (e.g. if the power converter 150 lacks an Rsense 410), the current sense amplifier (CSA) 260, multiple (e.g., at least three) comparators 250f-k, the error amplifier (EA) 310, the programmable reference generator 230, and the register set 210. The current sense resistor 410 may be coupled between the power control analog subsystem 160 and either a power supply voltage bus (VBUS) terminal 1103 (e.g., high side) or a ground terminal 1105 (e.g., low side, as illustrated). The ground terminal 1105 may be coupled to a ground return path of a VBUS 118, which carries the Vbus_in 120.

In some embodiments, the power control analog subsystem 160 may, e.g., via the programmable current sensing circuit 1100, be configured to concurrently compare a current flow through the Rsense 410 with at least two different reference values (e.g., at least two different reference voltages) to execute fault detection and monitoring related to the level of current of Vbus_in 120. More specifically, the CSA 260 may include a terminal (e.g., the CSP 420) that is coupled to the Rsense 410 in order to sense the voltage across the Rsense 410, e.g., between the CSP 420 and the ground terminal 1105. The CSA 260 may further amplify the voltage, using multiple gain options, to generate multiple analog output voltages or signals. The register set 210 may provide gain selection signals 1107 to program the CSA 260 to output the seven (or more or fewer) analog output voltages according to those multiple gain options. Each of the different analog output voltages may be indicative of a level of current of the Vbus_in 120, but now as amplified versions with which to make comparison to a different respective reference voltage. As illustrated, the CSA 260 generates seven analog output voltages, six of which may be input into one of each of the multiple comparators 250f-k.

Additionally or alternatively, one of the seven analog output voltages may be input into the error amplifier 310 to provide an analog feedback signal (FB signal), which will be discussed in more detail. The analog FB signal may provide constant current control capability to source or sink current at the midpoint of a voltage divider 1111 coupled to the VBUS 118 (e.g., at a node), to adjust the voltage of the VBUS, which in turn indirectly adjusts the current flow of Vbus_in 120. The voltage divider 1111 is just one example of translation circuitry that may translate the analog FB signal into a current that adjusts a voltage at a node coupled to the VBUS 118, which is to maintain approximately a constant current of the Vbus_in 120 signal.

In various embodiments, the programmable reference generator 230 may concurrently (e.g., simultaneously) generate multiple reference voltages (e.g., at least three reference voltages), which will be explained in more detail with reference to FIGS. 22A-22B. The programmable reference generator 230 may take register values from the register set 210 (e.g., vref_selx[m:0]) and program reference voltages for use by the multiple comparators 250f-k, by an SRSS 1113, and by the EA 310. In this way, each reference voltage may supply a different threshold voltage against which each respective comparator of the multiple comparators 250f-k and the EA 310 may be simultaneously compared, and based on which each comparator may generate a digital output (e.g., out_d<#> signals and the analog FB signal). The monitor levels of the analog output voltages (e.g., threshold voltages) may provide coverage for both light and relatively high loads, e.g., small current levels in the range of 0.1 A to large current levels in the range of tens of amps on the VBUS 118. The SRSS 1113 may provide a bandgap reference voltage (vbg) that the programmable reference generator 230 may employ to generate all other reference output voltages.

For example, when one of the comparators determines that its analog output voltage (from the CSA 260) exceeds the programmed reference voltage input from the programmable reference generator 230, that comparator may output a digital signal to trigger a different warning or system interrupt depending on the application for which the input reference voltage is adapted to detect. Depending on the current level of Vbus_in 120 and the voltage levels of the reverence voltages, more than one comparator may simultaneously output a digital signal to trigger a system interrupt. For example, the comparators may respectively trigger system interrupts indicative of conditions such as OCP, SCP, PFC, and SR.

Figure 12:
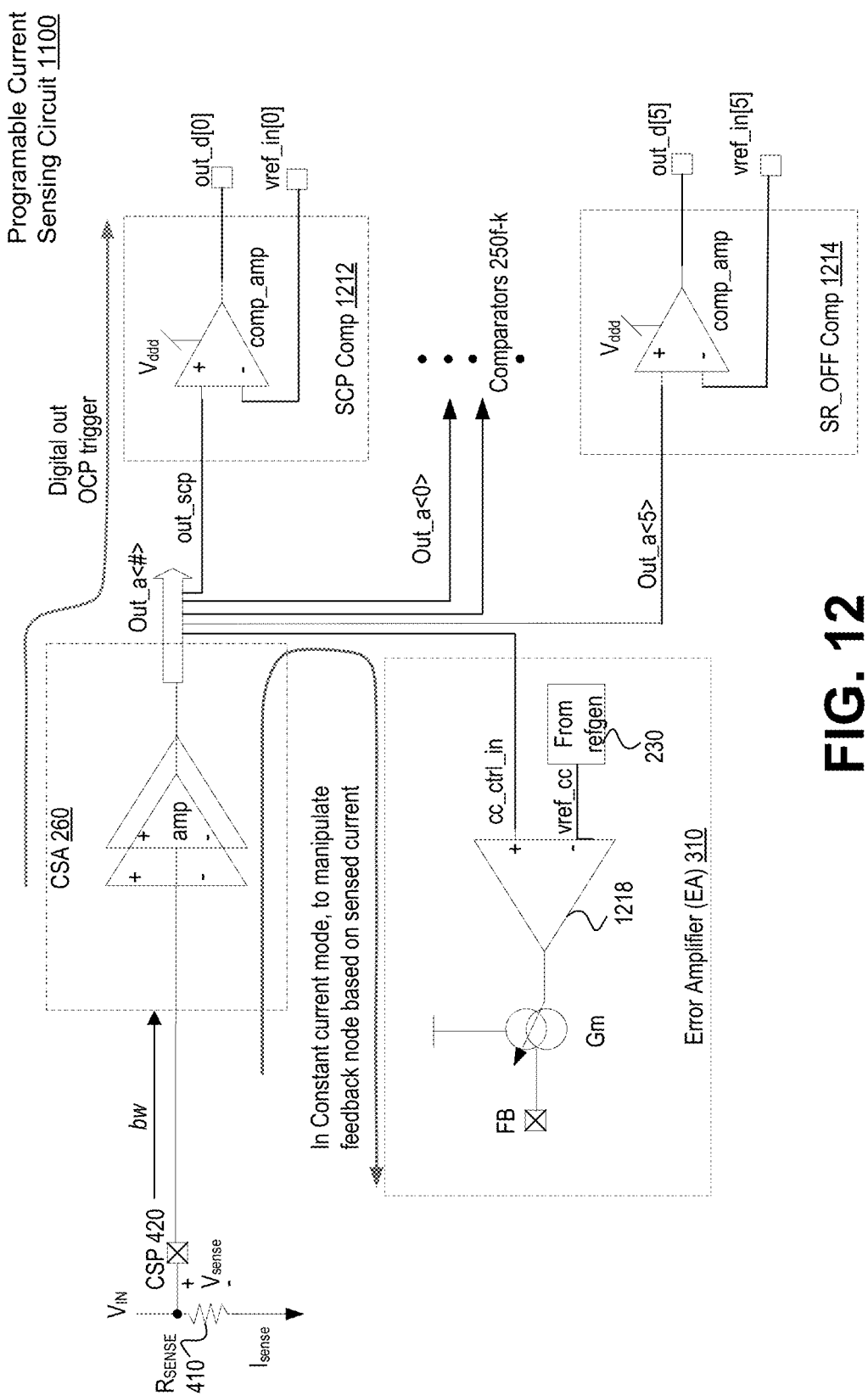
FIG. 12 is a circuit diagram illustrating sub-portions of the programmable current sensing circuit of FIG. 11, according to some embodiments.

FIG. 12 is a circuit diagram illustrating sub-portions of the programmable current sensing circuit 1100 of FIG. 11, according to some embodiments. For example, the sub-portions include the CSA 260, the EA 310, and the multiple comparators 250f-k, of which a SCP comparator 1212 (for short circuit protection) and a SR_OFF comparator 1214 (to turn off synchronous rectification) are illustrated. A short circuit protection (SCP) analog output voltage (out_scp) may also be independently and concurrently generated from fixed gain amplification of the Vsense across Rsense, which will be discussed in more detail with reference to FIG. 13 and Table 3.

In one embodiment, the CSA 260 may sense a voltage across the Rsense 410, amplify the voltage with a two-amplifier structure, and concurrently output the analog output voltages (out_a<#>) to the comparators 250f-k and the EA 310. The SCP comparator 1212 may compare an SCP analog output voltage (out_scp) to a SCP reference voltage (vref_in<0>) to generate an SCP digital output signal (e.g., out_d[0]), which may trigger to shut down the device 110 in response to a short circuit detection. For example, the SCP digital output signal may trigger an SCP system interrupt in response to the SCP analog output voltage exceeding the SCP reference voltage.

By way of example of comparator functionality, an SR_OFF comparator 1214 may compare an analog output voltage (e.g., out_a<5>) to a reference voltage (e.g., vref_in [5]) to generate a digital output signal (e.g., out_d[5]), which may trigger comparator 250j to turn off synchronous rectification, as previously discussed. The comparators 250f-k and the EA 310 may function concurrently to detect a number of different faults or warning conditions for which to generate a number of different system interrupts.

In one embodiment, in constant current mode, one of the analog output voltages (out_d<#>) is a constant current control input (cc ctrl in) to the EA 310. The EA 310 may compare (e.g., with an EA comparator 1218) the constant current control input to a voltage reference (e.g., vref_cc) from the programmable reference generator 230, to generate a difference between the constant current control input and the vref_cc voltage reference. The EA 310 may amplify the difference by its transconductance (Gm) to generate the analog FB signal on a feedback line coupled to the translation circuitry such as the voltage divider 1111 of the power converter 150 discussed with reference to FIG. 11. Accordingly, the EA 310 may be an operational transconductance amplifier (OTA) or similar amplifier whose differential input voltages produces an output current. The adjusted current in the feedback line may cause a change in voltage across the bottom resistor of the voltage divider 1111, which causes a change in voltage of Vbus_in 120 on the VBUS 118.

Figure 13:
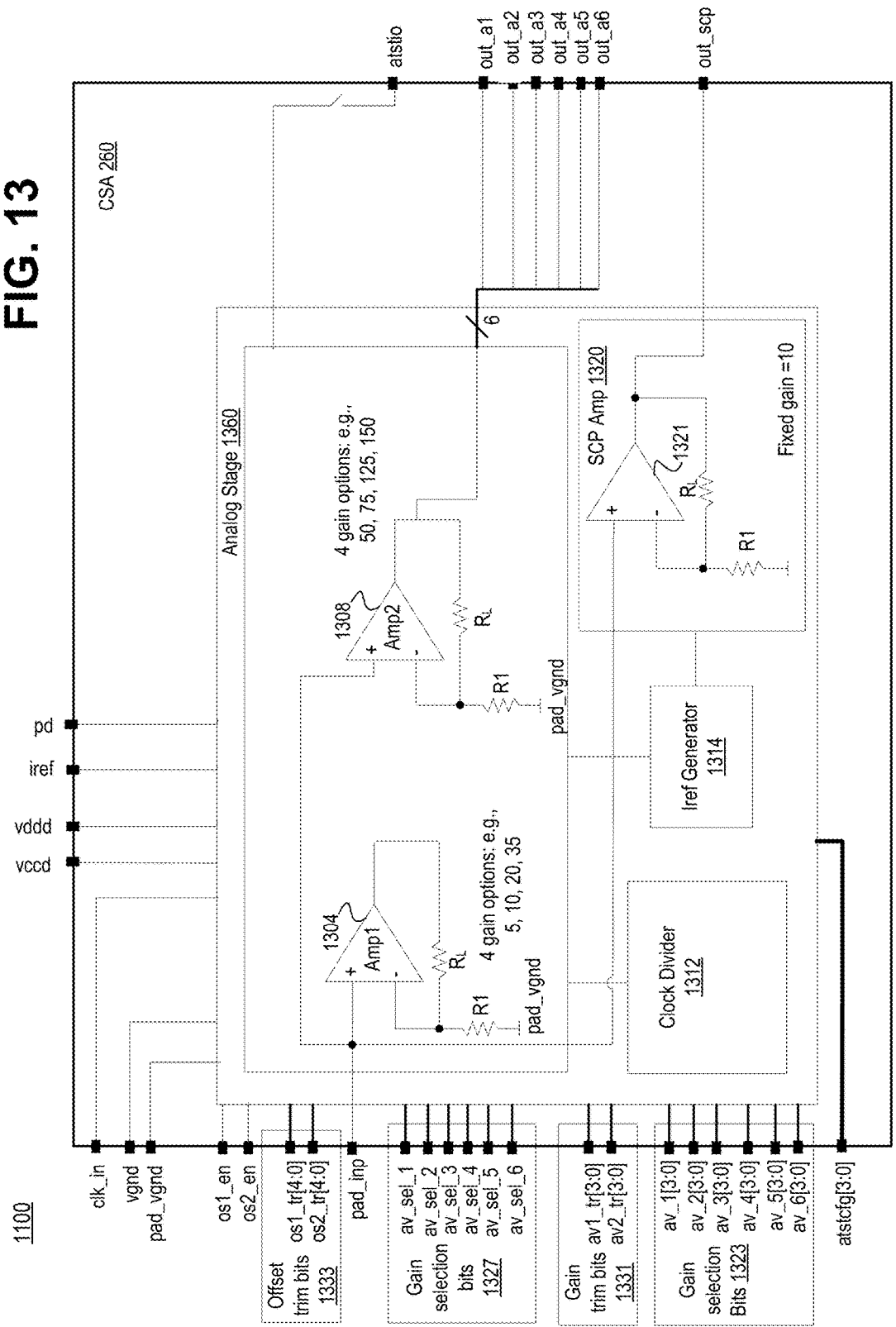
FIG. 13 is a circuit diagram illustrating programmable inputs and corresponding outputs of the current sense amplifier of the programmable current sensing circuit of FIG. 11, according to some embodiments.
Figure 14:
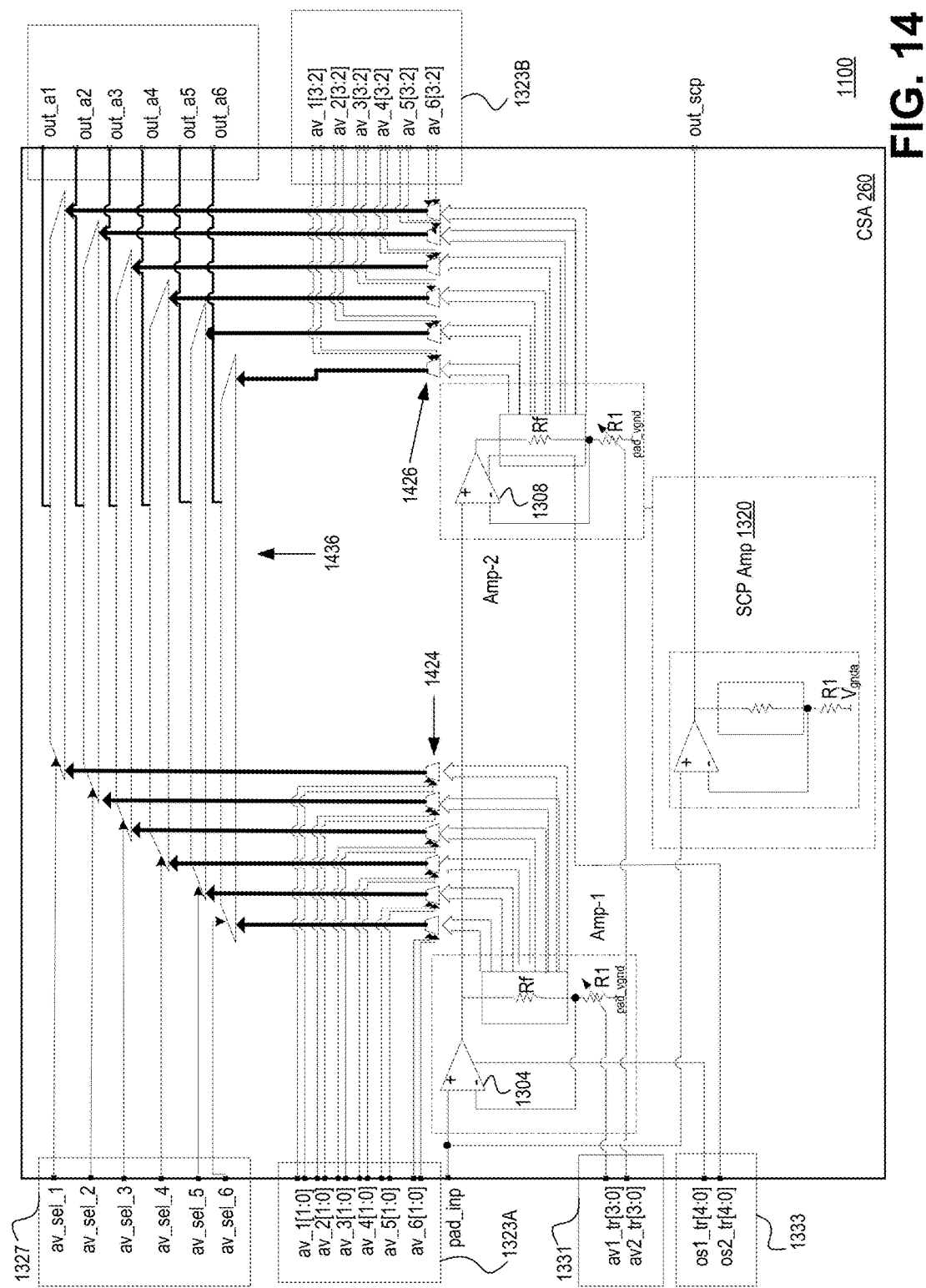
FIG. 14 is a circuit diagram illustrating a more detailed circuitry of the current sense amplifier of FIG. 13, according to some embodiments.

FIG. 13 is a circuit diagram illustrating programmable inputs and corresponding outputs of the current sense amplifier (CSA) 260 of the programmable current sensing circuit 1100 of FIG. 11, according to some embodiments. FIG. 14 is a circuit diagram illustrating a more detailed circuitry of the current sense amplifier 260 of FIG. 13, according to some embodiments.

With reference to FIGS. 13-14, the CSA 260 may include an analog stage 1360 having two amplifiers, each of which may operate by amplifying (e.g., via multiplication) the Vsense (from Isense through Rsense 410) by a programmable gain to produce an analog output voltage, one of which is selected for output. In various embodiments, the gain may be programmed through input signals (e.g., digital signals) that adjust the amplification, offset, and trim of the sensed voltage (Vsense) in order to simultaneously generate a number of available analog output voltages. A selection from among the available analog output voltages may be made to output at least six analog output voltages (out_a1 to out_a6). A short circuit protection (SCP) analog output voltage (out_scp) may also be independently and concurrently generated from fixed gain amplification of the Vsense, which will be discussed in more detail. Because these analog output voltages are to be all made available simultaneously to the comparators 250f-k, and to the EA 310 for concurrent monitoring purposes, the CSA 260 may provide different gain options for each of the applications concurrently, along with a separate gain option and output to be used by the EA 310 in constant current mode, which was discussed.

In various embodiments, the CSA 260 may provide a wide range of gains to cover a Vsense range of 1 millivolt (mV) through about 70 mV (or greater). The gains may be obtained from two amplifiers arranged in parallel, namely from a first amplifier 1304 and a second amplifier 1308. In one embodiment, the first amplifier 1304 may provide lower gains in a range from 5 to 35 (e.g., 5, 10, 20, and 35) and the second amplifier may provide higher gains in a range from 50 to 150 (e.g., 50, 75, 125, and 150), as will be discussed in more detail with reference to FIG. 19.

The CSA 260 may further include a clock divider 1312 to divide the clock to a usable frequency by the amplifiers of the analog stage 1360, a current reference generator (Iref Gen) 1314, a separate short circuit protection (SCP) amplifier 1320 having a fixed gain, multiple gain selection bits 1323, multiple gain selection bits 1327, multiple gain trim bits 1331, and multiple offset trim bits 1333. The Iref generator 1314 may receive an on-chip system reference current (iref) and produce the bias currents necessary to activate the two amplifiers 1304 and 1308 and to activate the SCP amplifier 1320. Both the first amplifier 1304 and the second amplifier 1308 may be trimmed for offset and gain through the multiple offset trim bits 1333 and the multiple gain trim bits 1331, respectively, which will be discussed in more detail with reference to FIG. 19.

With further reference to the first amplifier 1304 and the second amplifier 1308, a direct current (DC) gain may be the ratio of the resistors given by Equation (1).

$$V_{out\_a} = \left(1 + \frac{R_f}{R_1}\right) * V_{sense} = \left(1 + \frac{R_f}{R_1}\right) * (V_{csp}) \qquad (1)$$

The resistors $R_f$ and $R_1$ are coupled to the first amplifier 1304 and the second amplifier 1308 (FIGS. 13-14). This gain may therefore be adjusted with use of a resistor chain and different tap points (and/or gain trim) as will be discussed in more detail with reference to FIG. 19.

In various embodiments, the first amplifier 1304 is to amplify the sensed voltage (Vsense) concurrently into a first plurality of analog output voltages (e.g., using lower gain values). A first set of multiplexers 1424 may be coupled to the first amplifier 1304 and used to select one of the first plurality of analog output voltages in response to a first gain control signal from among a first set of gain selection bits 1323A. For example, in FIG. 14, the first set of multiplexers 1424 may include, from left to right, a first mux to select from four gain taps for OCP, a second mux to select from four gain taps for turning PFC off, a third mux to select from four gain gaps for turning PFC on, a fourth mux to select from four taps for turning SR off, a fifth mux to select from four taps for turning SR on, and a sixth mux to select form four gain taps for the analog output voltage going to the EA 310. The gain selection bits 1323A may be selected from those provided in the gain selection bits 1323 of FIG. 13.

In related various embodiments, the second amplifier 1308 is to amplify Vsense concurrently into a second plurality of analog output voltages that exceed the first plurality of analog output voltages due to being amplified by higher gain values. A second set of multiplexers 1426 may be coupled to the second amplifier 1308 and used to select one of the second plurality of analog output voltages in response to a second gain control signal from among a second set of gain selection bits 1323B. For example, in FIG. 14, the second set of multiplexers 1426 may include, from left to right, a first mux select from four gain taps for OCP, a second mux to select from four gain taps for turning PFC off, a third mux to select from four gain gaps for turning PFC on, a fourth mux to select from four taps for turning SR off, a fifth mux to select from four taps for turning SR on, and a sixth mux to select form four gain taps for the analog output voltage going to the EA 310. The gain selection bits 1323B may be selected from those provided in the gain selection bits 1323 of FIG. 13.

With further reference to FIG. 14, the CSA 260 may include a third set of multiplexers 1436 coupled to the first set of multiplexers 1424 and to the second set of multiplexers 1426. Each multiplexer of the third set of multiplexers 1426 may be coupled to a first mux of the first set of multiplexers 1424 having a set of four gain taps for a particular application or operation, e.g., OCP, PFC, SR, or EA, and to a corresponding second mux of the second set of multiplexers 1426, e.g., for the same four gain taps but at the higher gain levels associated with the second amplifier 1308. In this way, the CSA 260 may provide, through the third set of multiplexers 1426, the choice of selection from either the lower gain options or the higher gain options for any given application or operation. For example, each mux from among the third set of multiplexers 1436 may select an analog output voltage from between one of the first plurality of analog output voltages (selected by one of the first set of multiplexers 1424) and one of the second plurality of analog output voltages (selected by one of the second set of multiplexers 1426) in response to an analog voltage gain selection signal from among the gain selection bits 1327. In this way, the six analog output voltages (out_a1 through out_a6) may be generated.

In one embodiment, the SCP amplifier 1320 may be separate from the first amplifier 1304 and the second amplifier 1308, and may not have cancellation or trim for offset. For example, the gain may be fixed at 5, 10, 15 or the like and not be adjustable. Nominal current for the short circuit may be chosen to be 16 A. The SCP amplifier 1320 may include an SCP comparator 1321 with which to trigger an SCP output (out_scp).

Figure 15:
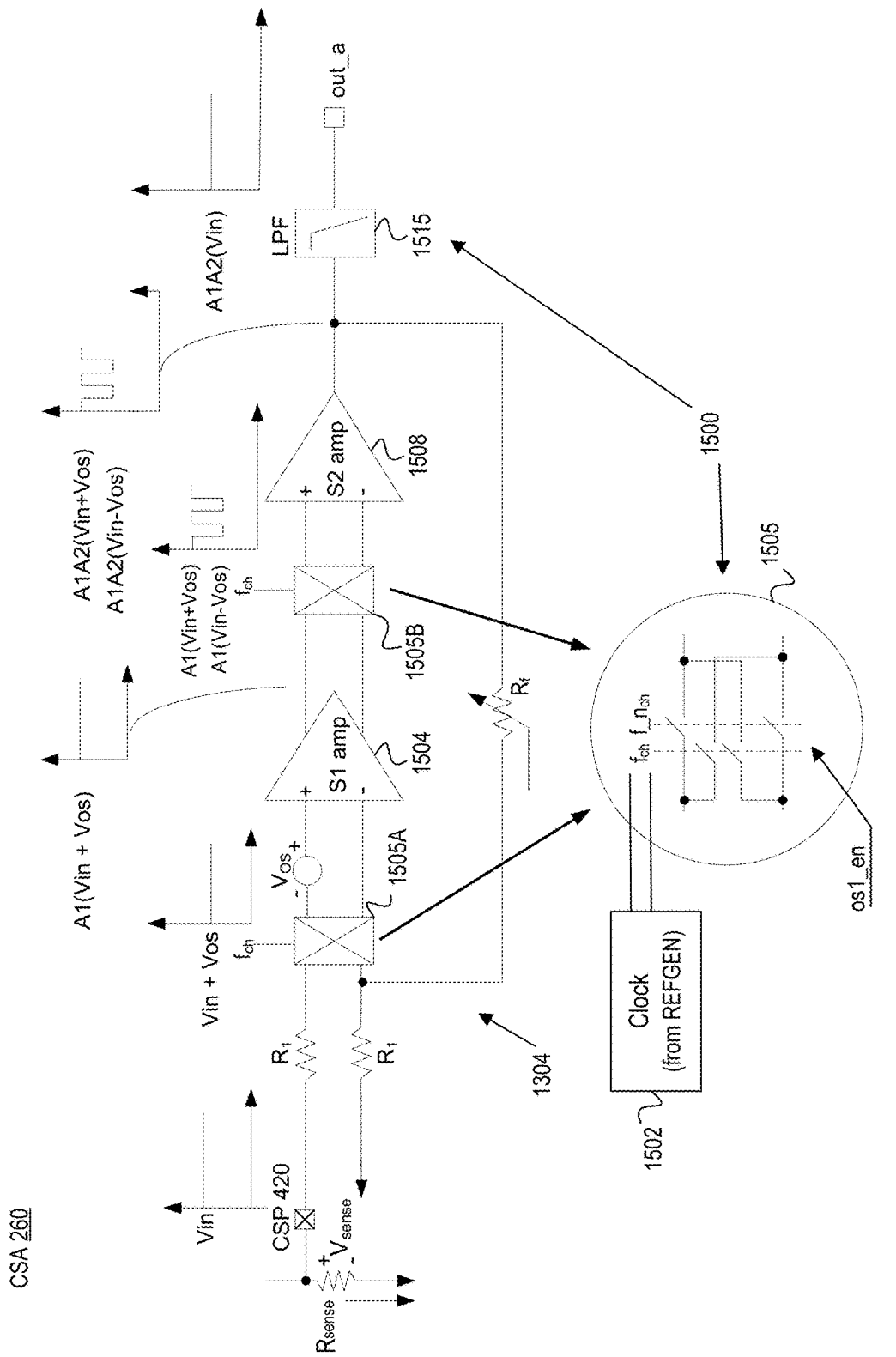
FIG. 15 is a circuit diagram of a current sense amplifier with offset cancellation circuitry, according to some embodiments.

FIG. 15 is a circuit diagram of the current sense amplifier (CSA) 260 with offset cancellation circuitry 1500, according to some embodiments. Each of the first amplifier 1304 and the second amplifier 1308 may be a difference amplifier to amplify a difference in voltage sensed across the Rsense 410 resistor. The current through the Rsense 410 resistor is sensed at the CSP 420 terminal and may be amplified using a non-inverting configuration with programmable gain, as discussed. The CSA 260 provides the ability to set its nominal gain through input control bus av_<#> and av_sel_<#> (FIGS. 13-14).

The first amplifier 1304 may be substantially identical to the second amplifier 1308, except for employing different gain options. Accordingly, FIG. 15 will be described with reference to just the first amplifier 1304, but understanding that the second amplifier 1308 will include similar structure and functionality. In one embodiment, the first amplifier 1304 may include a first amplifier stage 1504 and a second amplifier stage 1508, each that may have an internal offset voltage that is to be cancelled for best performance. The cancellation circuitry 1500 of the first amplifier 1304 and second amplifier 1308 may include a programmable clock 1505 and a low pass filter (LPF) 1515. Each of the first amplifier 1304 and the second amplifier 1308 may continuously cancel a corresponding internal offset voltage (e.g., in a range of about 0.6 mV to 0.7 mV, or approximately 0.65 mV) using the cancellation circuitry 1500, although understanding that alternative cancellation circuits are envisioned (see FIG. 24).

In various embodiments, the programmable clock 1505 may include a first clock switch 1505A positioned at the input of the first amplifier stage 1504 and a second clock switch 1505B positioned at the input of the second amplifier stage 1508, so as to cancel (or substantially cancel) the internal input offset voltages of the first amplifier 1304 In one embodiment, the same cancellation, including 1505A and 1505B may be repeated for the second amplifier 1308. Each clock switch 1505A and 1505B (e.g., set of clock switches) may employ continuous time correction to reduce the internal offset voltage ($V_{os}$ or $-V_{os}$) of the CSA 260, which is also referred to as input offset voltage of the first amplifier 1304 (and the second amplifier 1308). Since the internal offset voltage impacts the accuracy of the CSA 260, reducing the internal offset at the input may ensure good performance by the CSA 260.

The offset cancellation employs a clock 1502 (e.g., the input to the programmable clock 1505) that may be provided by the programmable reference generator 230. The clock 1502 may be provided either from an internal oscillator or an external clock. The internal oscillator frequency range may be between approximately 1-6 MHz. The CSA 260 may employ a divide-by-four configuration within the clock divider 1312 (FIG. 13) to obtain a usable clock range of between approximately 0.25-1.5 MHz. When an external clock is used, approximately 2 MHz is used to obtain a nominal 0.5 MHz clock at the output of the clock divider 1312.

The clock 1502 may trigger the clock switches 1505A and 1505B to translate (e.g., chop) the internal offset voltage associated with the first amplifier stage 1504 to a higher frequency, which is then eventually filtered out by the LPF 1515. The higher frequency may alternate between the clock 1502 ($f_{ch}$) and the complementary clock ($f\_n_{ch}$) of the clock 1502. More specifically, the complementary clocks ($f_{ch}$ and $f\_n_{ch}$) may cause the output signal (e.g., of each analog output voltages) to swing around the expected DC average to a level that correlates to the internal offset voltage in either direction, e.g., $+/-V_{os}$. This forms a voltage ripple at the expected DC average that may be filtered out by the LPF 1515. In this way, the LPF 1515 may continuously filter out the input offset voltage associated with the first amplifier 1304 and the second amplifier 1308.

In various embodiments, when the internal offset voltage of the first amplifier stage 1504 may be translated to frequency $f_{ch}$ using the first and second clock switches 1505A and 1505B, where the clock generation may be controlled by offset cancellation enable signal (e.g., os1_en illustrated in FIG. 13). The output of the two amplifier stages may be centered at the expected voltage level with a ripple of $+/-V_{os}$ at the clock frequency, which is illustrated in inset graphs above the second amplifier 1308 in FIG. 15. This $V_{os}$ ripple may then be removed with the low pass filter 1515, as mentioned. This method also removes low frequency noise in the system.

Figure 16:
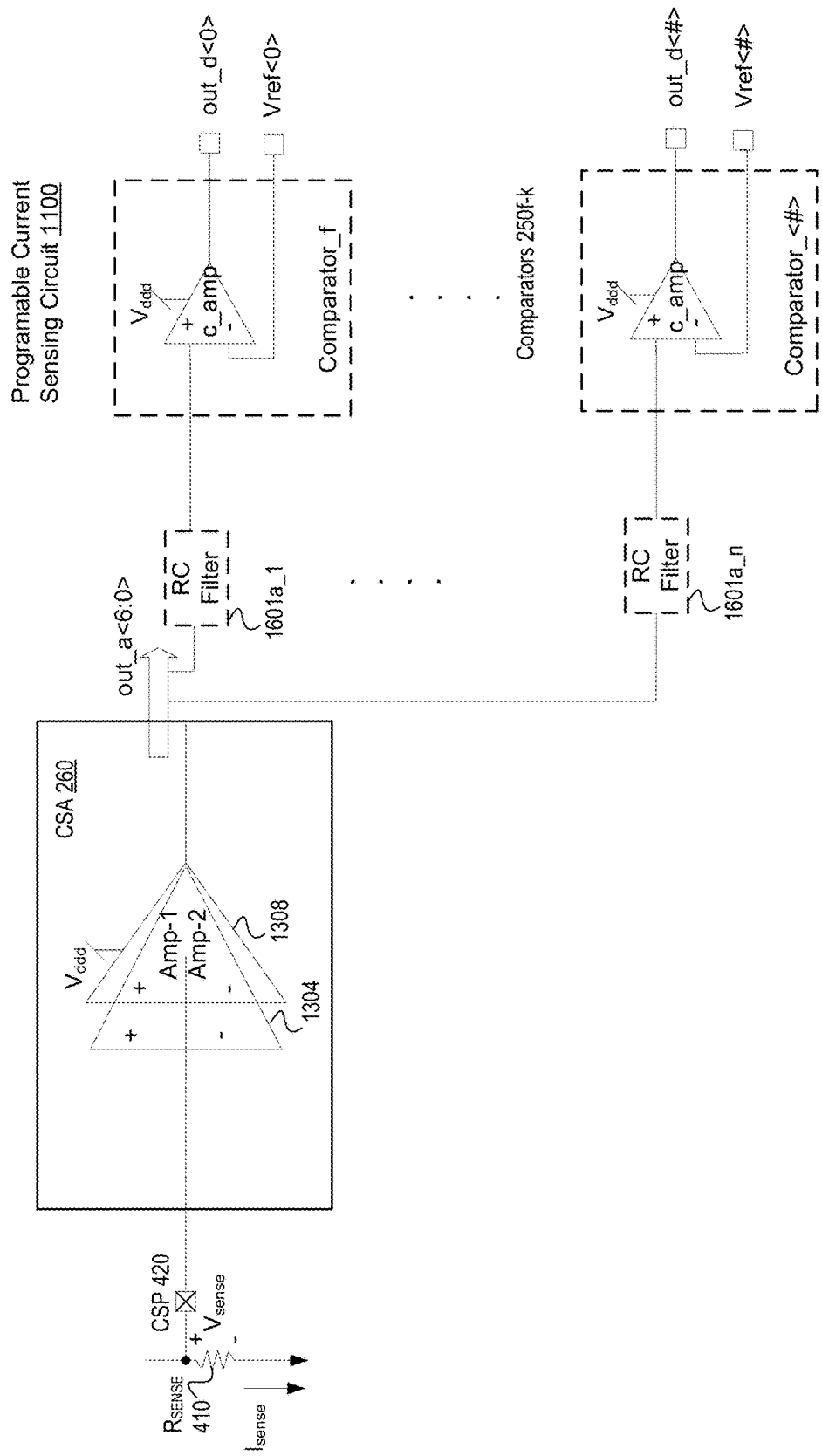
FIG. 16 is a circuit diagram illustrating the current sense amplifier of FIG. 15 and portions of the programmable current sensing circuit of FIGS. 11-14, according to some embodiments.

FIG. 16 is a circuit diagram illustrating the current sense amplifier (CSA) 260 of FIG. 15 and portions of the programmable current sensing circuit 1100 of FIGS. 11-14, according to some embodiments. The programmable current sensing circuit 110 illustrates an additional low-pass resistive-capacitive (RC) filter 1601*a*_1 to 1601*a*_*n* for each corresponding analog output voltage, out_a<6:0>. Each low-pass RC filter may further filter each analog output voltage before the latter go into respective comparator of the multiple comparators 250*f-k*.

Furthermore, with additional reference to FIG. 13, a separate ground pad (pad_vgnd) may be provided only for connection to the gain resistors of the first amplifier 1304 and the second amplifier 1308 to minimize offset error introduced by ground side IR voltage drop. This pad may be bonded out to the ground terminal pin.

Figure 17:
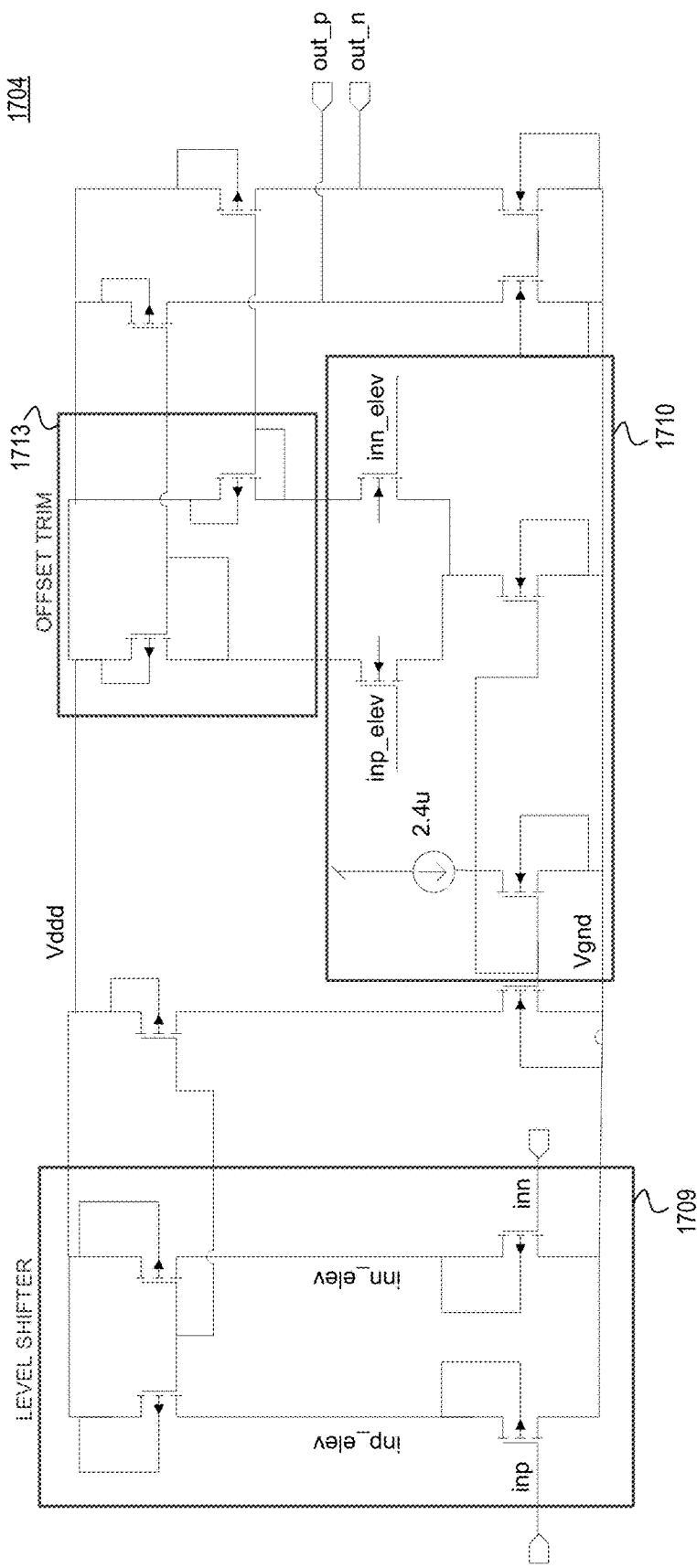
FIG. 17 is a circuit diagram of a first stage of an amplifier of the current sense amplifier of FIG. 11, according to some embodiments.

FIG. 17 is a circuit diagram of a first stage 1704 of an amplifier of the current sense amplifier of FIG. 11, according to some embodiments. The amplifier may be either of the first amplifier 1304 or the second amplifier 1308. The first stage 1704 may be a fully differential stage that incorporates a level shifter 1709 to raise the level of the input by a threshold. An active current mirror load 1710 may be trimmed for offset correction using devices added to either side as illustrated in an offset trim 1713 of FIG. 17, which is discussed with reference to FIG. 19 in more detail. The first stage 1704 may also bias the second stage (1808 in FIG. 18) at a required level of bias.

Figure 18:
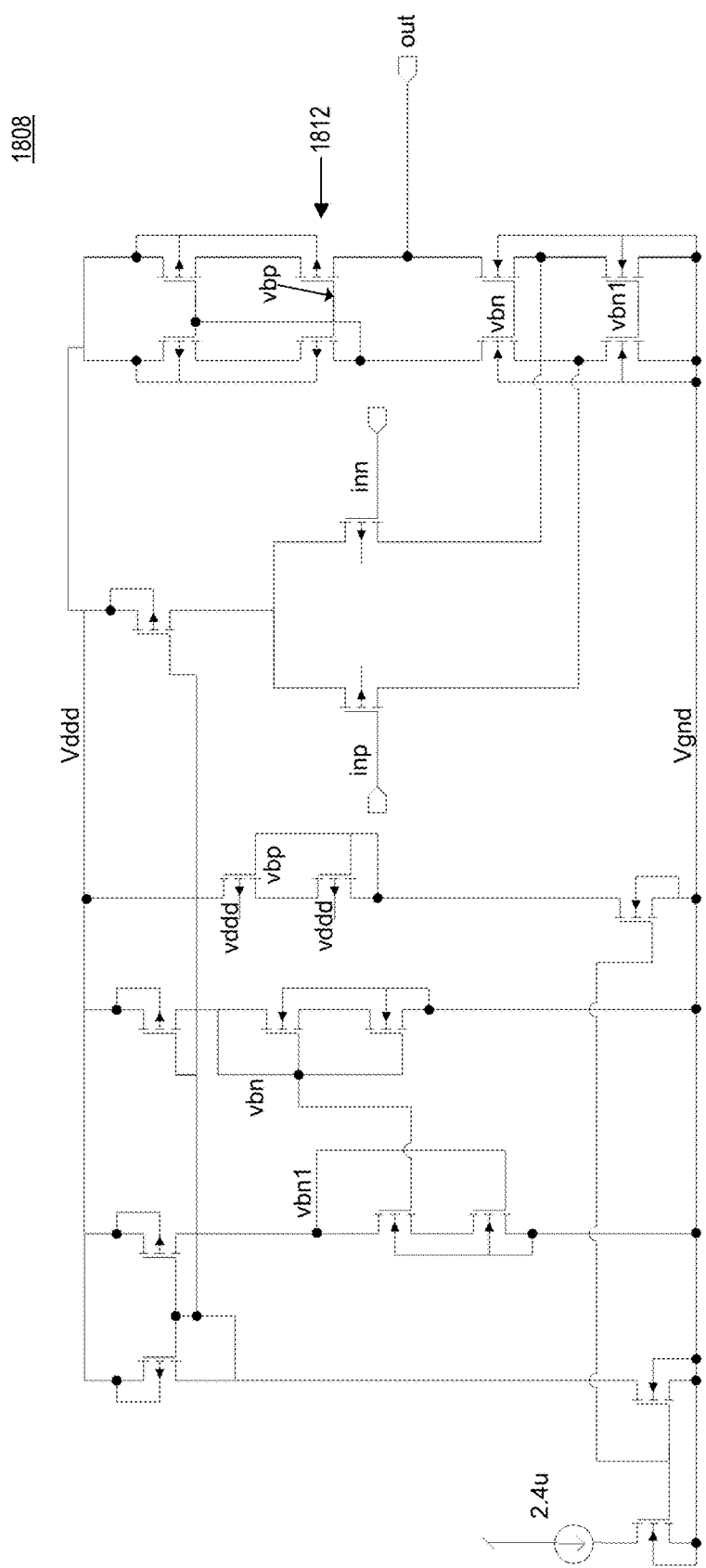
FIG. 18 is a circuit diagram of a second stage of an amplifier of the current sense amplifier of FIG. 11, according to some embodiments.

FIG. 18 is a circuit diagram of a second stage 1808 of an amplifier of the current sense amplifier of FIG. 11, according to some embodiments. The amplifier may be either of the first amplifier 1304 or the second amplifier 1308. The second stage 1808 may be a PMOS folded cascade and be single ended. The output resistor may be driven by a PFET 1812 to allow the highest gain to be as close to the supply as possible which allows the amplifier 1304 or 1308 to correctly amplify higher $V_{SENSE}$ values before saturating.

Figure 19:
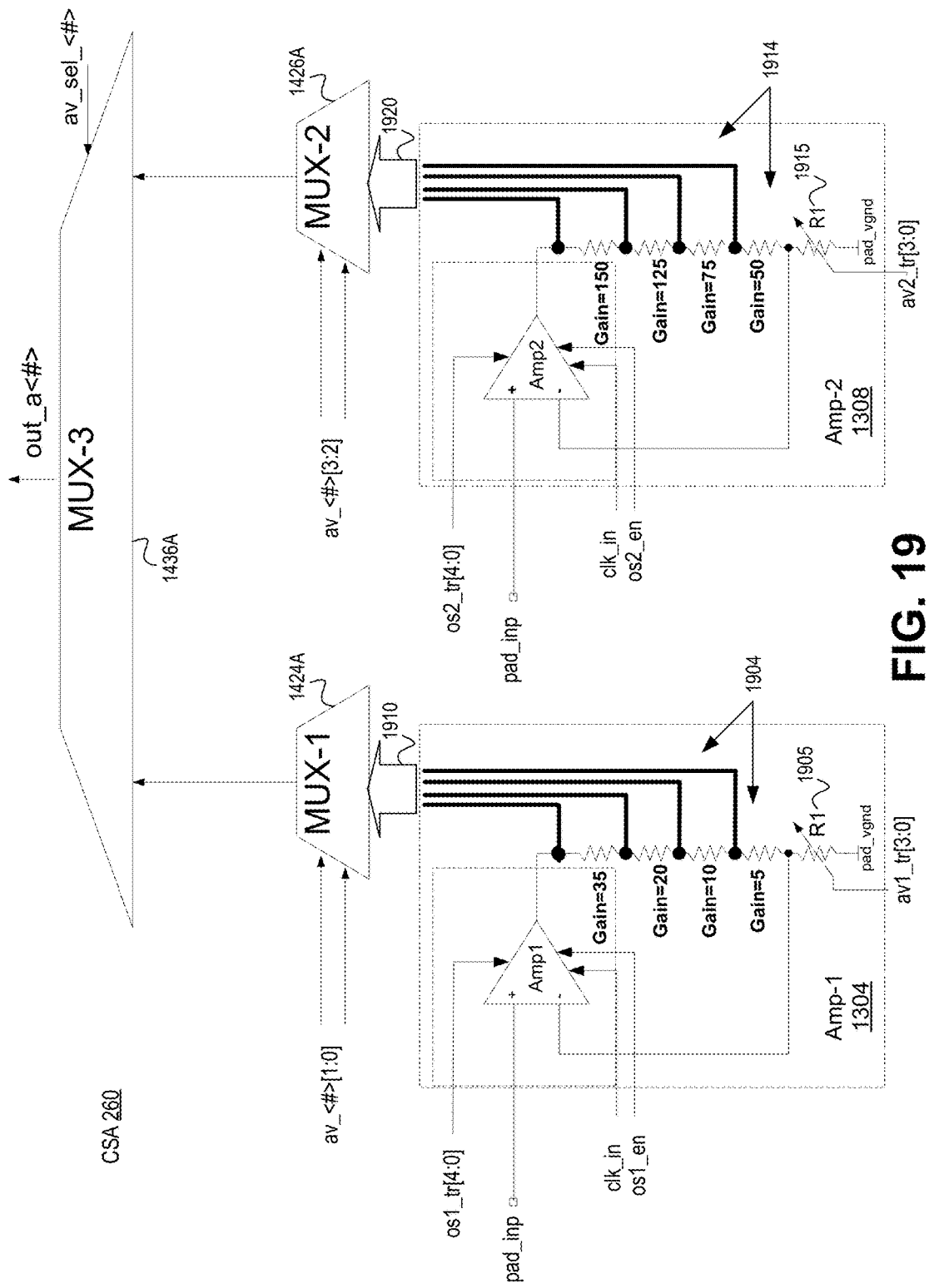
FIG. 19 is a circuit diagram of circuitry to facilitate adjustable gain of the first and second amplifiers of the current sense amplifier illustrated in FIGS. 13-14, according to some embodiments.

FIG. 19 is a circuit diagram of circuitry to facilitate adjustable gain of the first and second amplifiers 1304 and 1308 of the current sense amplifier (CSA) 260 illustrated in FIGS. 13-14, according to some embodiments. With additional reference to FIGS. 13-14, the first amplifier 1304 may include a first resistor chain 1904 with multiple tap locations to provide multiple first gains, e.g., 5, 10, 20, and 35, which together generate a first group of analog output voltages 1910. To provide a trim gain, a first variable resistor 1905 may be connected in series with the first resistor chain 1904, where a feedback point of connection to the first variable resistor 1905 may be selected based on a first output gain trim signal (av1_*tr*[3:0]) from the multiple gain trim bits 1331. Additionally, the second amplifier 1308 may include a second resistor chain 1914 with multiple tap locations to provide multiple second gains, e.g., 50, 75, 125, and 150, which together generate a second group of analog output voltages 1920. A second variable resistor 1914 may be connected in series with the second resistor chain 1914, where a feedback point of connection to the second variable resistor 1915 may be selected based on a second output gain trim signal (av2_*tr*[3:0]) of the multiple gain trim bits 1331.

In various embodiments, a first gain control signal from the first set of gain selection bits 1323A (e.g., av<#>[1:0]) may select, via a multiplexer 1424A of the first set of multiplexers 1424, a first analog output voltage of the first group of analog output voltages 1910, which respectively may correspond to the four gains available via the first resistor chain 1904. A second gain control signal from the second set of gain selection bits 1323B (e.g., av<#>[3:2]) may select, via a multiplexer 1426A of the second set of multiplexers 1426, a second analog output voltage of the second group of analog output voltages 1920, which respectively may correspond to the four gains available via the second resistor chain 1914. An analog voltage gain selection signal from the gain selection bits 1327 (e.g., av>sel_<#>) may then choose one of the first analog output voltage or the second analog output voltage via a multiplexer 1436A of the third set of multiplexers 1436. Each of these individual multiplexers may be duplicated for all six of the analog output voltages output by the CSA 260.

With continued reference to FIGS. 13-14 and FIG. 19, the first amplifier 1304 may further adjust its input offset voltage in an amount based on a first input offset trim signal (os1_*tr*[4:0]) of the multiple offset trim bits 1333. The second amplifier may further adjust its input offset voltage in an amount based on a second input offset trim signal (os2_*tr*[4:0]) of the multiple offset trim bits 1333. The os1_*en* and os2_*en* signals are to enable or disable the automated offset cancellation features discussed with reference to FIG. 15. Bandwidth trim (bw) (FIG. 12) may adjusts the AC performance of the CSA 260. When the CSP 240 does not require high bandwidths, this option may be used to minimize high frequency noise originating at the CSP 420 terminal.

The av_<#> register may provide nominal gain setting control for each of six different applications. Table 1 includes an embodiment of the gains available and the register programming, e.g., with control bits, that selects the corresponding gain to result in a particular analog output voltage.

TABLE 1

| av_<#>[3:2] | av_<#>[1:0] | av_sel_<#> | Gain |
|---|---|---|---|
| X | 0 | 0 | 5 |
| X | 1 | 0 | 10 |
| X | 2 | 0 | 20 |
| X | 3 | 0 | 35 |
| 0 | X | 1 | 50 |
| 1 | X | 1 | 75 |
| 2 | X | 1 | 125 |
| 3 | X | 1 | 150 |

The gain that may be used used for a particular $V_{SENSE}$ may be limited by the physical saturation point of the CSA 260. Table 2 illustrates the maximum $V_{SENSE}$ that may be correctly amplified by each amplifier 1304 (Amp-1) and 1308 (Amp-2). The limiting case is when Vddd is at the least possible value of 2.6V.

TABLE 2

| Amp-1 gain | Amp-1 gain | All gain options available | Amp-1 max (mV) = 2.6/35 | Amp-2 max (mV) = 2.6/150 |
|---|---|---|---|---|
| 35 | — | 35 | 74.29 | |
| 20 | — | 20 | | |
| 10 | — | 10 | | |
| 5 | — | 5 | | |
| — | 50 | 50 | | |
| — | 75 | 75 | | |
| — | 125 | 125 | | |
| — | 150 | 150 | | 17.3 |

The SCP amplifier 1320 may have a constant non-programmable gain of 10. This amplifier may not be trimmed for gain and offset. As noted in Table 3, the constant gain of 10 covers high load cases which trigger the SCP comparator 1321.

TABLE 3

| Rsense (mΩ) | Isense (A) | Vsense (mV) | Gain | Vout (mV) |
|---|---|---|---|---|
| 5 | 12 | 60 | 10 | 600 |
| 5 | 15 | 75 | 10 | 750 |
| 5 | 18 | 90 | 10 | 900 |
| 10 | 12 | 120 | 10 | 1200 |
| 10 | 15 | 150 | 10 | 1500 |
| 10 | 18 | 180 | 10 | 1800 |

The output gain trim signals av1_tr[3:0] and av2_tr[3:0] control the gain accuracy of the amplifier in the analog stage 1360. In one embodiment, the trim step is approximately 1% for the first amplifier 1304 and 1.5% for the second amplifier 1308. Trim functionality for the first output gain trim signal, av1_tr[3:0], is illustrated in Table 4 by way of example.

TABLE 4

| Trim av1_tr[3:0] | Result |
|---|---|
| 0 | Default (No trim) |
| N | (−N*Trim step) |
| 8 | Default (No trim) |
| N | (+N*Trim step) |

The offset trim signals os1_tr[4:0] and os2_tr[4:0] may control the input offset trimming of the first amplifier 1304 and the second amplifier 1308. In one embodiment, the trim step is approximately 1 mV for both amplifiers, where Table 5 illustrates amplifier input offset trim functionality of the first amplifier 1304 by way of example.

TABLE 5

| Trim os1_tr[2:0] | Result |
|---|---|
| 0 | Default (No trim) |
| N | (−N*Trim step) |
| 16 | Default (No trim) |
| N | (+N*Trim step) |

Figure 20:
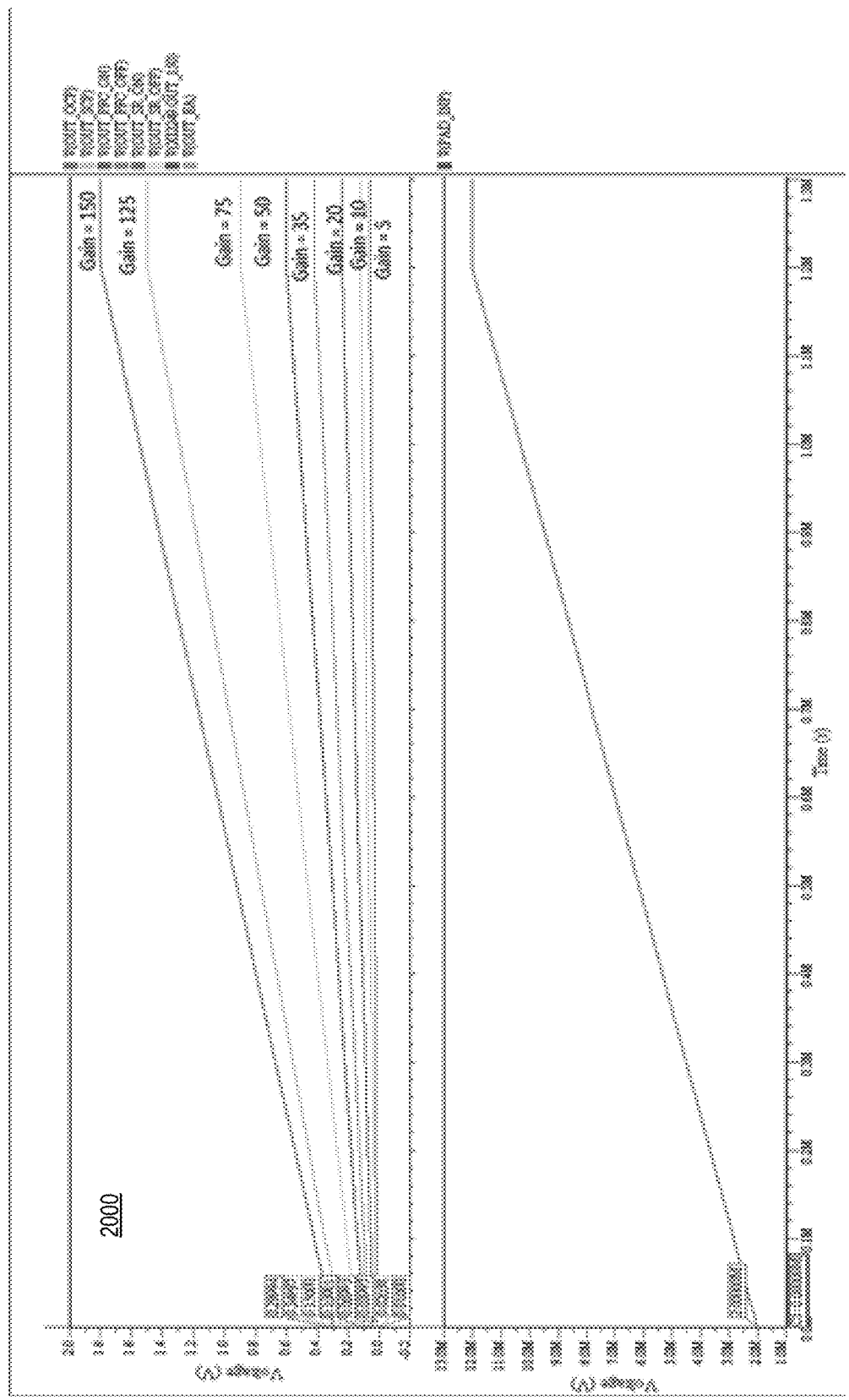
FIG. 20 is a graph illustrating a step response of the disclosed current sense amplifier that results in multiple analog output voltages, according to some embodiments.

FIG. 20 is a graph 2000 illustrating a step response of the disclosed current sense amplifier (CSA) 260 that results in multiple analog output voltages, according to some embodiments. The data plots on the graph 2000 illustrates eight possible gain values with the input (Vsense) ramped up from 2 mV to 12 mV. The output is a linear plot with the slope reelecting the gain.

FIG. 21A is a graph illustrating a step input voltage into the disclosed current sense amplifier, according to one embodiment. FIG. 21B is a graph illustrating an analog output voltage of the current sense amplifier in response to the step input voltage of FIG. 21A, according to one embodiment. FIG. 21C is a graph illustrating an output of a comparator for over current protection in response to the analog output voltage of FIG. 21B, according to one embodiment. FIG. 21D is a graph illustrating a reference voltage input into the comparator of FIG. 21C, according to one embodiment. Note that the analog output voltage for the gain of 150 (FIG. 21B) has a worst case delay of about 45 microseconds, which is marked with the solid vertical line.

Figure 22A:
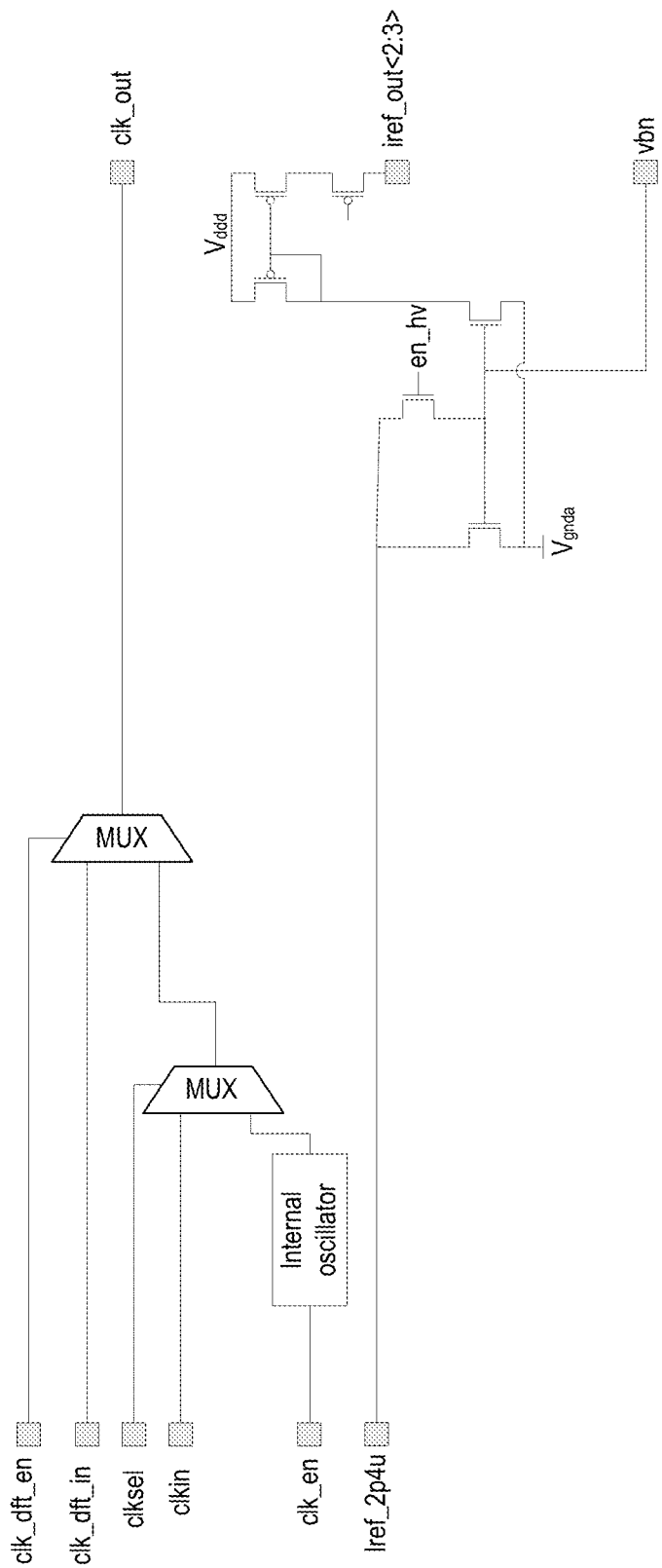
FIGS. 22A and 22B are a circuit diagram of a reference voltage generator for the programmability of the programmable current sensing circuit of FIG. 11, according to some embodiments.
Figure 22B:
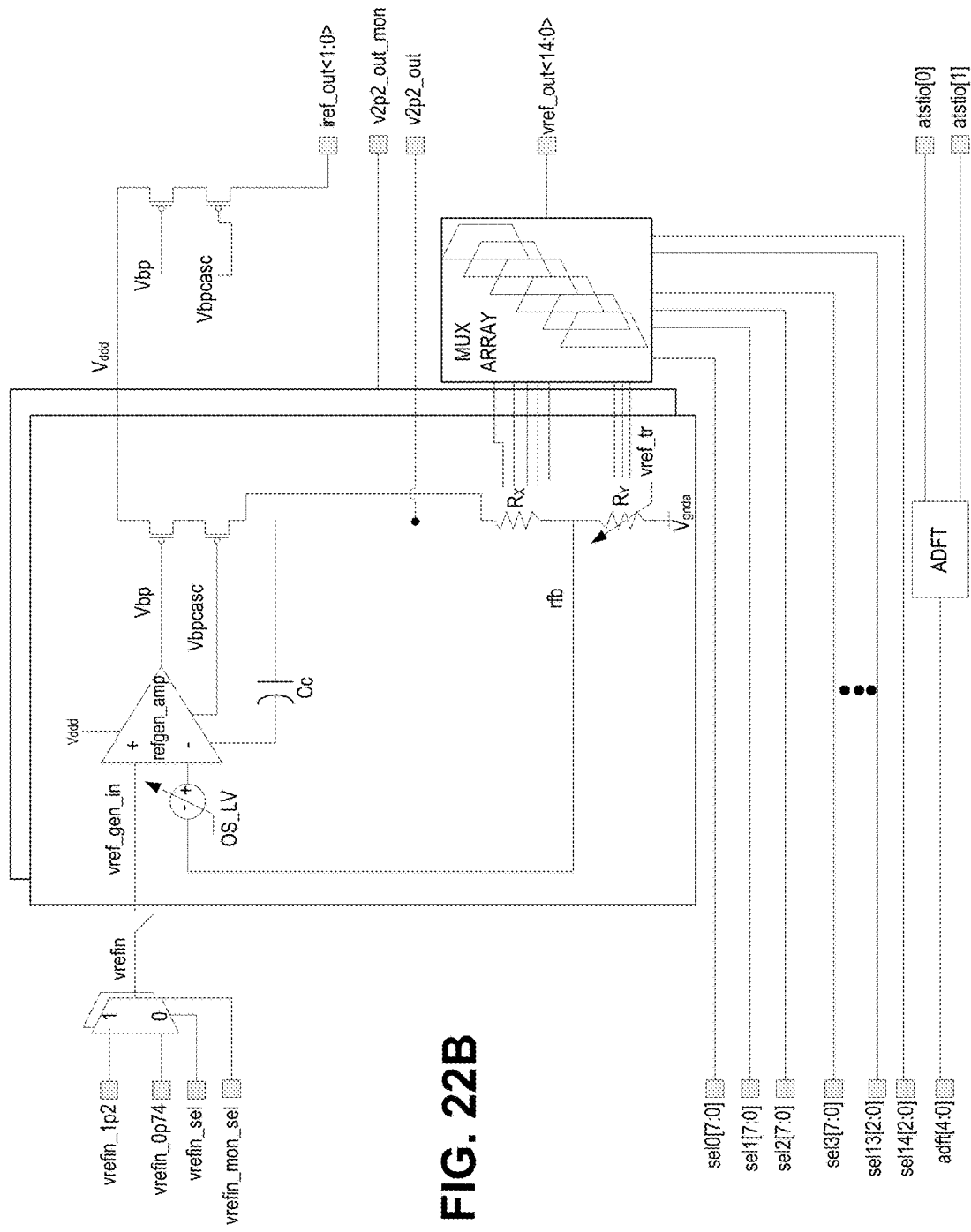

FIGS. 22A and 22B are a circuit diagram of the programmable reference generator 230 for the programmability of the programmable current sensing circuit 1100 of FIG. 11, according to some embodiments. In various embodiments, the programmable reference generator 230 produces several voltage reference outputs and provides a number of features. One feature includes common selection of the source Vref signal to be either the bandgap (1.2V) or beta-multiplier (0.74V) reference. Another feature is to provide two voltage references, one for monitoring circuitry and the other for regulatory circuitry. The monitoring circuitry may require less accuracy and use the beta-multiplier (0.74V) deep-sleep reference while the regulation circuits may require higher accuracy and use the bandgap (1.2V) reference. Another feature is to choose between an internal oscillator and external peripheral clock that may be routed to the CSA 260 to be used as the input to the clock divider 1312. The divided clock may run the chopping switches associated with the programmable clock 1505 (FIG. 15).

FIG. 22A illustrates clock generation and selection to generate an output clock (clk_out), e.g., based on an internal oscillator or an external peripheral clock. FIG. 22B illustrates fifteen voltage references (vref_out<14:0) generated by the programmable reference generator 230. The multiple comparators 250k-f coupled to the outputs of the CSA 260 may use monitor side references, which may be varied in steps of approximately 10 millivolts (mV) from approximately 0.13V to 2.12V. The digital output of each comparator is may be interpreted as a trigger by the CPU 220 (FIG. 2).

Figure 23:
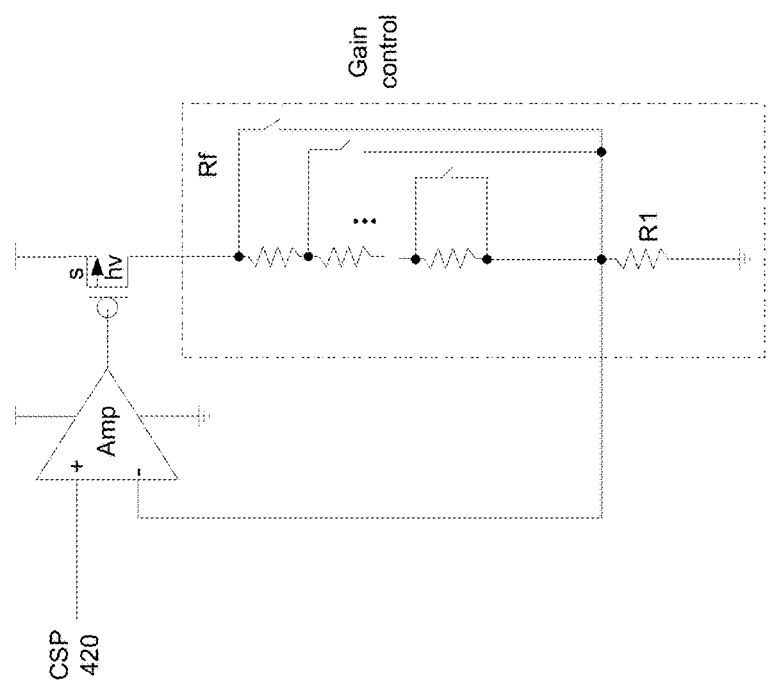
FIG. 23 is a circuit diagram of dynamic switch gain options as an alternative to the multiplexers of the programmable current sensing circuit of FIG. 14, according to some embodiments.

FIG. 23 is a circuit diagram of dynamic switch gain options as an alternative to the multiplexers of the programmable current sensing circuit of FIG. 14, according to some embodiments. Gain options may be dynamically switched out (instead of a static selection) to allow for sensing of higher $V_{SENSE}$ voltages and flexibility in choosing gain for appropriate $V_{SENSE}$ ranges. The circuit of FIG. 23 may be implemented at the cost of adding switches which introduce leakage and occupy area, and also that a wide range of gain may not be programmed simultaneously. Cascaded stages with lower gain resistors may provide a similar array of gain options. Independent amplifiers for each of the monitor outputs may be employed.

Figure 24:
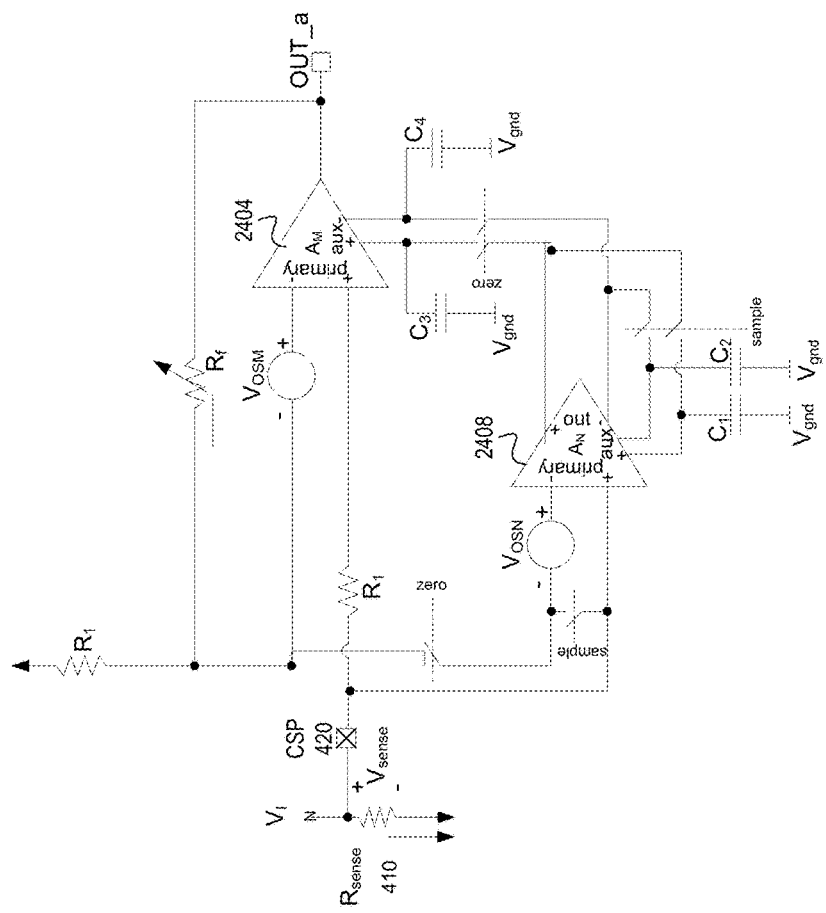
FIG. 24 is a circuit diagram of offset cancellation using chopper-stabilized architecture, according to some embodiments.

FIG. 24 is a circuit diagram of offset cancellation using chopper-stabilized architecture, according to some embodiments. The precision of lower offset may be obtained by alternative continuous cancellation techniques such as the chopper stabilized method. In this implementation, an auxiliary amplifier is used in parallel to the main wideband amplifier to effectively amplify the signal orders of magnitude more than the offset ($V_{osm}$ or $V_{osn}$), thereby ensuring that the offset is a smaller percentage of the amplified output. This method, however, may result in a residual offset. Each of the independent monitors may use a reference generated by a separate reference generator circuit.

More specifically, the embodiment of FIG. 24 may include a first amplifier 2404 and a second amplifier 2408. The first amplifier 2404 may have a first input offset, $V_{osm}$. The second amplifier 2408 may function to cancel the first input offset, but has its own second input offset, $V_{osn}$. The capacitors may hold feed forward signals, and capacitors C3 and C4 may be trimmed.

Figure 25:
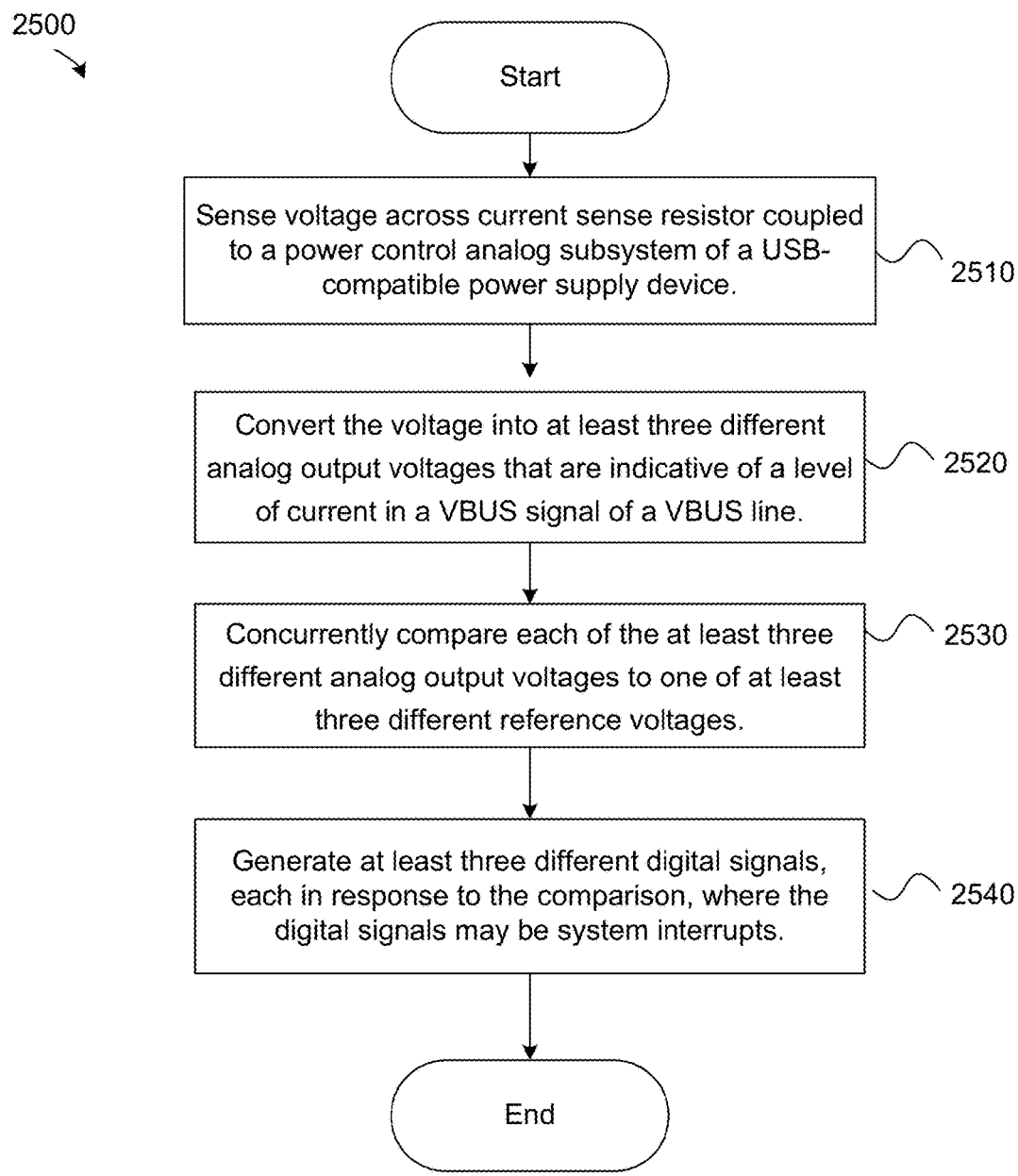
FIG. 25 is a flow chart for a method of sensing a voltage to generate multiple analog output voltages for concurrent comparison, according to one embodiment.

FIG. 25 is a flow chart for a method 2500 of sensing a voltage to generate multiple analog output voltages for concurrent comparison, according to one embodiment. The method 2500 may be performed by processing logic that comprises hardware (e.g., circuitry, dedicated logic, programmable logic, microcode, etc.). In some embodiments, the method 2500 is performed wholly or in part by SBPD device 110, 200. In some embodiments, the method 500 is performed by power control analog subsystem 160 or 300.

In some embodiments, the method 2500 is performed by the programmable current sense circuit 1100, the current sense amplifier 260, and the comparators 250f-k.

With reference to FIG. 25, the method 2500 may begin with the processing logic sensing a voltage across a current sense resistor coupled to a power control analog subsystem of a universal serial bus (USB) compatible power supply device and to one of one of a VBUS terminal or a ground terminal (2510). The method 2500 may continue with the processing logic converting the voltage into at least three different analog output voltages that are indicative of a level of current in a power supply voltage bus (VBUS) signal of a VBUS of the USB compatible power supply device (2520). The method 2500 may continue with the processing logic concurrently comparing each of the at least three different analog output voltages to one of at least three different reference voltages (2530). The method 2500 may continue with the processing logic generating at least three different digital signals, each in response to the comparison in block 2530, where the digital signals may be system interrupts. For example, results of the comparing may respectively trigger system interrupts indicative of conditions such as OCP, SCP, PFC, and SR.

In the above description, numerous details are set forth. It will be apparent, however, to one of ordinary skill in the art having the benefit of this disclosure, that embodiments of the present disclosure may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "adjusting," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth above are merely exemplary. Particular embodiments may vary from these exemplary details and still be contemplated to be within the scope of the present disclosure.

It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

In the above description, for purposes of explanation, numerous specific details are set forth in order to provide a thorough understanding of the present disclosure. It will be evident, however, to one skilled in the art that the present disclosure may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the disclosure. The phrase "in one embodiment" located in various places in this description does not necessarily refer to the same embodiment.

What is claimed is:

1. A device comprising:
   a power control analog subsystem of a universal serial bus-power delivery (USB-PD) compatible device, the power control analog subsystem comprising a programmable current sensing circuit; and
   a current sense resistor coupled to the power control analog subsystem, wherein the power control analog subsystem is configured to concurrently compare a current flow through the current sense resistor with at least three different reference values, wherein the programmable current sensing circuit comprises:
      a terminal coupled to the current sense resistor;
      a current sense amplifier coupled to the terminal to:
         sense a voltage across the current sense resistor; and
         amplify the voltage concurrently into a plurality of analog output voltages, each based on a different gain and to indicate a level of current of a power supply voltage bus (VBUS) signal; and
      at least three comparators coupled to the current sense amplifier.

2. The device of claim 1, wherein the current sense resistor is coupled between the power control analog subsystem and one of a VBUS terminal or a ground terminal, wherein the ground terminal is coupled to a ground return path of a VBUS signal.

3. The device of claim 1, wherein the current sense amplifier further comprises:
   a first amplifier to amplify the voltage concurrently into a first plurality of analog output voltages;
   a first multiplexer coupled to the first amplifier and to select one of the first plurality of analog output voltages in response to a first gain control signal;
   a second amplifier to amplify the voltage concurrently into a second plurality of analog output voltages that exceed the first plurality of analog output voltages;
   a second multiplexer coupled to the second amplifier and to select one of the second plurality of analog output voltages in response to a second gain control signal; and
   a third multiplexer coupled to the first multiplexer and the second multiplexer to select the first analog output voltage from between the one of the first plurality of analog output voltages and the one of the second plurality of analog output voltages in response to an analog voltage gain selection signal.

4. The device of claim 3, wherein the first amplifier comprises:
   a first resistor chain to provide a plurality of first gains, which together generate the first plurality of analog output voltages; and
   a first variable resistor connected in series with the first resistor chain, wherein a feedback point of connection to the first variable resistor is selected based on a first output gain trim signal; and
   wherein the second amplifier comprises:
   a second resistor chain to provide a plurality of second gains, which together generate the second plurality of analog output voltages, the plurality of second gains being greater than the plurality of first gains; and
   a second variable resistor connected in series with the second resistor chain, wherein a feedback point of connection to the second variable resistor is selected based on a second output gain trim signal.

5. The device of claim 3, further comprising internal offset cancellation circuitry of the first amplifier to:
   translate an input offset voltage of the first amplifier to a high-frequency offset signal around a DC voltage; and
   filter the plurality of analog output voltages with a low pass filter, to continuously filter out the higher frequency offset signal.

6. The device of claim 1, wherein the current sense amplifier further comprises a short circuit protection (SCP) amplifier to amplify the voltage to generate an SCP analog output voltage, and wherein the device further comprises at least a fourth comparator to:
   compare the SCP analog output voltage with an SCP voltage reference; and
   trigger an SCP system interrupt in response to the SCP analog output voltage exceeding the SCP voltage reference.

7. The device of claim 1, wherein at least three comparators are to concurrently compare respective ones of the plurality of analog output voltages with corresponding ones of a plurality of reference voltages, the device further comprising a reference generator coupled to the current sense amplifier, wherein the reference generator is programmable to generate the plurality of reference voltages in steps of approximately 10 millivolts between approximately 0.13 volts and 2.12 volts.

8. The device of claim 1, wherein the at least three comparators are to concurrently compare respective ones of the plurality of analog output voltages with corresponding ones of a plurality of reference voltages, the device further comprising an error amplifier coupled to the current sense amplifier, the error amplifier to:
   determine a difference between a second analog output voltage of the plurality of analog output voltages and a second reference voltage of the plurality of reference voltages; and
   amplify the difference by a transconductance of the error amplifier to generate an analog feedback signal on a feedback line coupled to a midpoint of a voltage divider that is coupled to a power supply bus carrying the VBUS signal.

9. A circuit comprising a power control analog subsystem of a universal serial bus power delivery (USB-PD) compatible device, the power control analog subsystem comprising a programmable current sensing circuit configured to:
- use a current sense amplifier of the programmable current sensing circuit coupled to a terminal of the programmable sensing circuit to sense a voltage across a current sense resistor coupled to the power control analog subsystem, wherein the terminal is coupled to the current sense resistor;
- convert the voltage into at least three different analog output voltages that are indicative of a level of current in a VBUS signal of a VBUS of the USB-PD compatible device, wherein the current sense amplifier coupled to the terminal to concurrently amplify the voltage into the at least three different analog output voltages, each based on a different gain; and
- concurrently compare each of the at least three different analog output voltages to respective ones of at least three different reference voltages.

10. The circuit of claim 9, wherein the current sense resistor is coupled between the power control analog subsystem and one of a VBUS terminal or a ground terminal, wherein the ground terminal is coupled to a ground return path of the VBUS signal.

11. The circuit of claim 9, further comprising an error amplifier coupled to the current sense amplifier, the error amplifier to:
- determine a difference between a first analog output voltage of the at least three different analog output voltages and a first reference voltage of the at least three reference voltages;
- amplify the difference to generate an analog feedback signal; and
- translate the analog feedback signal into a current that indirectly adjusts a voltage of the VBUS, to maintain approximately a constant current on the VBUS.

12. The circuit of claim 9, wherein the programmable current sensing circuit further comprises a plurality of comparators coupled to the current sense amplifier, the plurality of comparators to concurrently compare respective ones of the at least three different analog output voltages with corresponding ones of the at least three different reference voltages, wherein a first comparator of the plurality of comparators is to generate a digital signal comprising a system interrupt in response to detection of a first analog output voltage of the at least three different analog output voltages exceeding a corresponding first reference voltage of the at least three different reference voltages.

13. The circuit of claim 9, wherein the current sense amplifier further comprises:
- a first amplifier to amplify the voltage concurrently into a first plurality of analog output voltages;
- a first multiplexer coupled to the first amplifier and to select one of the first plurality of analog output voltages in response to a first gain control signal;
- a second amplifier to amplify the voltage concurrently into a second plurality of analog output voltages that exceed the first plurality of analog output voltages;
- a second multiplexer coupled to the second amplifier and to select one of the second plurality of analog output voltages in response to a second gain control signal; and
- a third multiplexer coupled to the first multiplexer and the second multiplexer to select the first analog output voltage from between the one of the first plurality of analog output voltages and the one of the second plurality of analog output voltages in response to an analog voltage gain selection signal.

14. A method comprising:
- sensing a voltage across a current sense resistor coupled to a power control analog subsystem of a universal serial bus-power delivery (USB-PD) compatible device and to one of one of a VBUS terminal or a ground terminal; and
- concurrently comparing, by a programmable current sensing circuit, each of at least three different analog output voltages, which are based on the voltage, to respective ones of at least three different reference voltages, wherein the concurrently comparing comprises converting, by the programmable current sensing circuit of the power control analog subsystem, the voltage into the at least three different analog output voltages that are indicative of a level of current in a VBUS signal of a VBUS of the USB-PD compatible device, wherein the converting comprises amplifying, by a current sense amplifier, the voltage sensed across a current sense resistor concurrently into the at least three different analog output voltages, each based on a different gain.

15. The method of claim 14, further comprising:
- generating, using a programmable reference generator coupled to the current sense amplifier, a plurality of reference voltages, which include the at least three different reference voltages;
- comparing, by a plurality of comparators coupled to the current sense amplifier, ones of the at least three different analog output voltages to respective ones of the plurality of reference voltages; and
- outputting, by a first comparator of the plurality of comparators, a digital signal comprising a system interrupt in response to detecting a first analog output voltage of the at least three different analog output voltages exceeding a corresponding first reference voltage of the plurality of reference voltages.

16. The method of claim 15, wherein the plurality of reference voltages are generated in steps of approximately 10 millivolts ranging between approximately 0.13 volts and 2.12 volts.

17. The method of claim 15, wherein amplifying comprises:
- amplifying, using a first amplifier, the voltage concurrently into a first plurality of analog output voltages;
- selecting, using a first multiplexer coupled to the first amplifier, one of the first plurality of analog output voltages in response to a first gain control signal;
- amplifying, using a second amplifier, the voltage concurrently into a second plurality of analog output voltages that exceed the first plurality of analog output voltages;
- selecting, using a second multiplexer coupled to the second amplifier, one of the second plurality of analog output voltages in response to a second gain control signal; and
- selecting, using a third multiplexer coupled to the first multiplexer and the second multiplexer, the first analog output voltage from between the one of the first plurality of analog output voltages and the one of the second plurality of analog output voltages in response to an analog voltage gain selection signal.

* * * * *